(12) United States Patent
Matsumoto et al.

(10) Patent No.: US 8,973,440 B2
(45) Date of Patent: Mar. 10, 2015

(54) PIEZOELECTRIC RESONATOR ELEMENT, PIEZOELECTRIC RESONATOR, PIEZOELECTRIC OSCILLATOR, RESONATOR GYRO ELEMENT, RESONATOR GYRO SENSOR, AND ELECTRONIC APPARATUS

(75) Inventors: Takanobu Matsumoto, Kamiina (JP); Akinori Yamada, Ina (JP)

(73) Assignee: Seiko Epson Corporation (JP)

( * ) Notice: Subject to any disclaimer, the term of this patent is extended or adjusted under 35 U.S.C. 154(b) by 235 days.

(21) Appl. No.: 13/404,527

(22) Filed: Feb. 24, 2012

(65) Prior Publication Data

US 2012/0216614 A1 Aug. 30, 2012

(30) Foreign Application Priority Data

Feb. 25, 2011 (JP) ................................. 2011-039519
Mar. 4, 2011 (JP) ................................. 2011-047268

(51) Int. Cl.
*G01C 19/56* (2012.01)
*H03H 9/02* (2006.01)
(Continued)

(52) U.S. Cl.
CPC . *H03H 9/02* (2013.01); *H03H 9/10* (2013.01); *H03H 9/19* (2013.01)
USPC .................................... 73/504.16; 73/504.12

(58) Field of Classification Search
CPC .......... G01C 19/5607; G01C 19/5621; G01C 19/5628; G01C 19/5719; G01C 19/5733; H03H 9/19; H03H 9/21
USPC ........................... 73/504.16, 504.12; 310/370
See application file for complete search history.

(56) References Cited

U.S. PATENT DOCUMENTS 4,320,320 A 3/1982 Momosaki et al.
7,015,630 B2 * 3/2006 Tanaya .......................... 310/370
(Continued)

FOREIGN PATENT DOCUMENTS

JP 53-002097 1/1977
JP 55-075326 6/1980
(Continued)

OTHER PUBLICATIONS

Momosaki, et al. "New Quartz Tuning Fork with Very Low Temperature Coefficient", Suwa Seikosha Co., Ltd. Suwa Japan, (pp. 247-254) (1979).

(Continued)

*Primary Examiner* — Helen Kwok
(74) *Attorney, Agent, or Firm* — Harness, Dickey & Pierce, P.L.C.

(57) ABSTRACT

A piezoelectric substrate includes vibrating arms, a base portion to which one end portion of each vibrating arm is connected, spindle portions formed in the other end portion of each vibrating arm, formed to have a large width, and having first groove portions formed therein, and second groove portions that are formed along the resonator center line of each vibrating arm, and flexure-torsional combined resonator is excited. A piezoelectric resonator element has flexural resonator of flexure-torsional combined resonator that is excited as its principal resonator and sets the cutting angle of the piezoelectric substrate, the widths and the depths of the first groove portion and the second groove portion, and the thickness of the vibrating arm such that the frequency-temperature characteristics represent third-order characteristics with respect to the temperature.

12 Claims, 16 Drawing Sheets

(51) Int. Cl.
*H03H 9/10* (2006.01)
*H03H 9/19* (2006.01)

(56) References Cited

U.S. PATENT DOCUMENTS

| | | | |
|---|---|---|---|
| 7,015,631 B2* | 3/2006 | Hirasawa et al. | 310/370 |
| 7,043,986 B2* | 5/2006 | Kikuchi et al. | 73/504.12 |
| 7,412,885 B2 | 8/2008 | Ogura | |
| 7,714,484 B2* | 5/2010 | Hara et al. | 310/348 |
| 7,859,172 B2* | 12/2010 | Ishikawa et al. | 310/348 |
| 7,863,804 B2* | 1/2011 | Tanaya | 310/370 |
| 7,906,890 B2* | 3/2011 | Kawanishi et al. | 310/370 |
| 8,164,393 B2* | 4/2012 | Yamada | 331/156 |
| 8,432,087 B2* | 4/2013 | Yamada et al. | 310/370 |
| 2012/0137775 A1* | 6/2012 | Yamada | 73/504.16 |

FOREIGN PATENT DOCUMENTS

| | | |
|---|---|---|
| JP | 59-202720 | 11/1984 |
| JP | 61-187411 | 8/1986 |
| JP | 2004-282230 | 10/2004 |
| JP | 2010-002430 | 1/2010 |
| JP | 2011-019159 A | 1/2011 |

OTHER PUBLICATIONS

Momosaki, et al. "Tuning-fork quartz resonator featuring temperature characteristics at least on a par with the characteristics of an AT-cut quartz plate", Nikkei Electronics (pp. 146-167) (Nov. 1979).

\* cited by examiner

PIEZOELECTRIC RESONATOR ELEMENT, PIEZOELECTRIC RESONATOR, PIEZOELECTRIC OSCILLATOR, RESONATOR GYRO ELEMENT, RESONATOR GYRO SENSOR, AND ELECTRONIC APPARATUS

BACKGROUND

1. Technical Field

The present invention relates to a piezoelectric resonator element, a resonator gyro element, and the like, and more particularly, to a piezoelectric resonator element, a piezoelectric resonator, a piezoelectric oscillator, a resonator gyro element, and a resonator gyro sensor that are decreased in size and have improved frequency-temperature characteristics and an electronic apparatus using them.

2. Related Art

Generally, in a small-size information device such as a mobile computer, a hard disk drive or a mobile communication device such as a cellular phone, a piezoelectric device is widely used as a reference frequency source. In accordance with the progress of decrease in size of electronic apparatuses in which a piezoelectric device is mounted, a further decrease in the size of the piezoelectric device has been requested.

In JP-A-55-75326, a tuning fork type quartz crystal resonator is disclosed which is cut out in the range of 0° to −15° at the rotation of an electric axis (one of crystal axes) of quartz crystal. The frequency-temperature characteristics of the flexural resonator mode of the principal resonator of the quartz crystal resonator are enhanced by approaching and combining the resonance frequencies $f_F$ and $f_T$ of the flexural resonator mode and the torsional resonator mode that are excited in the tuning fork type crystal quartz resonator.

Generally, the frequency-temperature characteristics $\Delta f/f$ of a quartz crystal resonator is represented by a polynomial with respect to temperature T. However, for practical use, the frequency-temperature characteristics are approximated as a cubic polynomial, and the first-order coefficient to the third-order coefficient are denoted by $\alpha$, $\beta$, and $\gamma$. The frequency-temperature characteristics $Tf_F$ of the flexural resonator mode are influenced by the torsional resonator mode and depend on the thickness h of a piezoelectric substrate. The thickness h is set such that the first-order coefficient $\alpha=0$ for various cutting angles $\theta$, and, additionally, the cutting angle $\theta$ and the thickness h for which the second-order coefficient $\beta$ is zero are set from values acquired in advance through calculation. Accordingly, the frequency-temperature characteristics $Tf_F$ depend only on the third-order coefficient $\gamma$, and it is disclosed that a quartz crystal resonator having satisfactory temperature characteristics is acquired.

In addition, in JP-A-2004-282230, a tuning fork type piezoelectric resonator is disclosed in which an expansion portion wider than a vibrating arm is disposed in each tip end portion of a plurality of vibrating arms that are parallel to one another. It has been written therein that the expansion portion has a bottomed hole, and a material having a specific gravity higher than that of a piezoelectric material is filled in the bottomed hole so as to serve as a spindle, whereby the miniaturization of the tuning fork type piezoelectric resonator is achieved.

Furthermore, in JP-A-2010-2430, a resonator gyro element is disclosed. The resonator gyro element includes: a base portion; one pair of detection vibrating arms that extend from the base portion to both sides in a linear shape; one pair of connecting arms extending from the base portion to both sides in directions perpendicular to the detection vibrating arms; and one pair of driving vibrating arms extending from the tip end portions of the connecting arms to both sides to be perpendicular to the tip end portions. In addition, two pairs of beams extending from the base portion along the detecting arms and one pair of support portions to which the beams extending in the same direction are connected are included in the same plane, and the support portions are configured to be arranged on the outer side of the detection vibrating arms in directions in which the detection vibrating arms extend and between the driving vibrating arms.

However, according to the tuning fork type piezoelectric resonator, which is disclosed in JP-A-55-75326, of which the frequency-temperature characteristics are improved by approaching and combining the frequencies of the flexural resonator mode and the torsional resonator mode, there is a problem in that it is difficult to decrease the size thereof.

In addition, according to the tuning fork type piezoelectric resonator disclosed in JP-A-2004-282230, although the size thereof can be decreased by forming the spindle portion in the tip end portion of the vibrating arm, the frequency-temperature characteristics have second-order characteristics, and there is a problem in the frequency stability.

Furthermore, according to the resonator gyro element disclosed in JP-A-2010-2430, there is a problem in that the sensitivity for the angular velocity changes in accordance with a change in the temperature.

SUMMARY

An advantage of some aspects of the invention is that it provides a piezoelectric resonator element, a piezoelectric resonator, a piezoelectric oscillator, and a resonator gyro sensor that are decreased in size and have improved frequency-temperature characteristics and an electronic apparatus using them.

Application Example 1

This application example is directed to a piezoelectric resonator element including: a piezoelectric substrate including at least a plurality of vibrating arms, a base portion to which one end portion of each one of the vibrating arms is connected, spindle portions that are connected to the other end portion of each one of the vibrating arms and have a width larger than that of the other end portion of each one of the vibrating arms, a first groove portion that extends along a longitudinal direction of each one of the vibrating arms on at least one of front and rear faces of the spindle portion, and a second groove portion that is disposed on front and rear faces of each one of the vibrating arms; and excitation electrodes that are formed on the front and rear faces of the spindle portion and the front and rear faces and both side faces of each vibrating arm including the inside of each second groove portion and are electrically connected to a plurality of electrode pads disposed in the base portion. In addition, the piezoelectric resonator element performs flexure-torsional combined resonator, and the frequency-temperature characteristics of the piezoelectric resonator element represent third-order characteristics with respect to the temperature.

Each spindle portion is formed in the tip end portion of each vibrating arm of the tuning fork type piezoelectric resonator element, the first groove portion extending in a linear shape along the longitudinal direction of the vibrating arm on the front and rear faces of the spindle portion is formed, and the second groove portion is formed on the front and rear faces along the resonator center line of each vibrating arm. By configuring as such, the flexural resonator and the torsional resonator excited in the tuning fork type piezoelectric resonator element can approach each other so as to be combined together. The frequency-temperature characteristics of the flexural resonator of the flexure-torsional combined resonator have third-order characteristics with respect to the temperature, and there is an advantage of acquiring the piezoelectric resonator element that has superior temperature characteristics and has a small size.

Application Example 2

This application example is directed to the piezoelectric resonator element according to Application Example 1, wherein the base portion includes: a base portion main body that includes one end connected to the one end portion of each one of the vibrating arms; a connection portion that is connected to the other end located on a side facing the one end connected to the vibrating arms of the base portion main body; and a support arm that is connected through the connection portion and extends to be separated from the base portion main body.

The base portion of the piezoelectric resonator element includes the base portion main body, the connection portions, and the support arms having an "L" shape and a reverse "L" shape, the end portions of the "L" shape and the reverse "L" shape are connected to each other, and each connection portion is configured to be connected to the center of one end portion of the base portion main body through the connection portion. Accordingly, the resonator energy leaking to the support arms from the vibrating arms can be reduced, whereby the CI value is small, and the impact resistance is improved. As a result, there is an advantage of acquiring a piezoelectric resonator element having no problem of frequency variations due to a damage, a destruction, or the like that is caused by an impact.

Application Example 3

This application example is directed to the piezoelectric resonator element according to Application Example 1 or 2, wherein the piezoelectric substrate is configured by a quartz crystal plate, and a normal line of a principal face of the quartz crystal plate is inclined by an angle within a range of 0 degree to −15 degrees with respect to an optical axis of a quartz crystal in accordance with rotation of an electric axis of the quartz crystal.

The tuning fork type piezoelectric resonator element is configured in which the cutting angle of the piezoelectric substrate is rotated around the electric axis (the X axis) in the range of 0 degree to −15 degrees. By selecting the cutting angle as such, the first-order coefficient and the second-order coefficient of the polynomial representing the frequency-temperature characteristics of the flexure-torsional combined resonator can be configured to be approximately zero, and there is an advantage of acquiring a piezoelectric resonator element having superior temperature characteristics.

Application Example 4

This application example is directed to the piezoelectric resonator element according to any one of Application Examples 1 to 3, wherein the first groove portion includes a plurality of grooves separately aligned along the longitudinal direction.

By configuring the piezoelectric resonator element in which the first groove portions are formed as described above, the frequency-temperature characteristics of the flexure resonator of the flexure-torsional combined resonator have third-order characteristics with respect to the temperature, and there are an advantage of acquiring the piezoelectric resonator element having superior temperature characteristics and an advantage of forming the lead electrodes that electrically connect the excitation electrodes on the flat faces of the spindle portions.

Application Example 5

This application example is directed to the piezoelectric resonator element according to any one of Application Examples 1 to 3, wherein the first groove portions extend from tip end edges of the spindle portions to center portions of the spindle portions and are formed at positions, which have line symmetry with respect to a resonator center line of the vibrating arms, located on the front and rear faces of the spindle portions.

By configuring the piezoelectric resonator element in which the first groove portions are formed as described above, the frequency-temperature characteristics of the principal resonator of the flexure-torsional combined resonator have third-order characteristics with respect to the temperature, and there are an advantage of improving the temperature characteristics and an advantage of forming the lead electrodes that electrically connect the excitation electrodes on the flat faces of the spindle portions.

Application Example 6

This application example is directed to the piezoelectric resonator element according to any one of Application Examples 1 to 3, wherein the first groove portion is formed to be continuous from the second groove portion, and tip end portions of the first groove portions extend up to front end edges of the spindle portions and are formed at positions, which are symmetrical to each other with respect to the resonator center line, located on the front and rear faces of the spindle portions.

By configuring the piezoelectric resonator element in which the first groove portions are formed as described above, the frequency-temperature characteristics of the flexure resonator of the flexure-torsional combined resonator have third-order characteristics with respect to the temperature, and there are an advantage of improving the temperature characteristics of the piezoelectric resonator element and an advantage of easily forming masks used for forming the first and second groove portions.

Application Example 7

This application example is directed to the piezoelectric resonator element according to Application Example 5, wherein a width of at least a part of the first groove portion is formed to be larger than that of the second groove portion.

By configuring the piezoelectric resonator element in which the first groove portions are formed as described above, the frequency-temperature characteristics of the flexure resonator of the flexure-torsional combined resonator have third-order characteristics with respect to the temperature, and there are an advantage of improving the temperature characteristics of the piezoelectric resonator element and an advantage of easily combining the flexure resonator frequency and the torsional resonator frequency by appropriately setting the width of the first groove portions.

Application Example 8

This application example is directed to a piezoelectric resonator including: the piezoelectric resonator element according to any one of Application Examples 1 to 6; and an insulating substrate that carries the piezoelectric resonator element.

The piezoelectric resonator is configured by allowing the flexural resonator and torsional resonator excited in the tuning fork type piezoelectric resonator element to approach each other and housing the tuning fork type piezoelectric resonator element in which the flexure-torsional combined resonator is excited in an insulating substrate, whereby there is an advantage of acquiring a piezoelectric resonator that has a high Q value due to its small size and has superior frequency-temperature characteristics.

Application Example 9

This application example is directed to a piezoelectric oscillator including: the piezoelectric resonator element according to any one of Application Examples 1 to 6; an IC component that excites the piezoelectric resonator element; and a package that seals the piezoelectric resonator element in an air-tight manner and houses the IC component.

The piezoelectric oscillator is configured so as to include: the tuning fork type piezoelectric resonator element in which the flexural resonator and the torsional resonator approach each other, and the flexure-torsional combined resonator is excited; an IC component; and a package that houses the tuning fork type piezoelectric resonator element and the IC component, whereby there is an advantage of acquiring a small-size piezoelectric oscillator having superior frequency-temperature characteristics.

Application Example 10

This application example is directed to a resonator gyro element including: the piezoelectric resonator element according to Application Example 1, and the piezoelectric resonator element includes a detecting vibrating arm that is connected to the base portion and is used for detecting an angular velocity.

The resonator gyro element is configured in which each spindle portion is formed in the tip end portion of each driving vibrating arm, first groove portions extending in a linear shape along the longitudinal direction of the vibrating arm are formed on the front and rear faces of the spindle portion, and second groove portions are formed on the front and rear faces along the resonator center line of each driving vibrating arm. By configuring such a resonator gyro element, the frequency-temperature characteristics of the flexural resonator that is the principal resonator of the flexure-torsional combined resonator excited in each driving vibrating arm represent third-order characteristics with respect to the temperature, and accordingly, there is an advantage of acquiring the resonator gyro element that has superior temperature characteristics and a small size.

Application Example 11

This application example is directed to a resonator gyro sensor including: the resonator gyro element according to Application Example 10; and a package that houses the resonator gyro element.

Application Example 12

This application example is directed to a piezoelectric resonator element including: a piezoelectric substrate including a plurality of vibrating arms, a base portion to which one end portion of each one of the vibrating arms is connected, spindle portions that are formed to the other end portion of each one of the vibrating arms and have a width larger than that of each one of the vibrating arms, and groove portions that are formed on the front and rear faces along the resonator center of each vibrating arm; and excitation electrodes that are formed on both faces of the spindle portion and the front and rear faces and the side faces of each vibrating arm including the inside of each groove portion and are electrically connected between a plurality of electrode pads disposed in the base portion. Each spindle portion includes mass portions having a heavy mass on both sides of the resonator center, the mass portions are configured so as to be symmetrical with respect to the resonator center, the flexural resonator of the flexure-torsional combined resonator excited in the piezoelectric resonator element is configured as its principal resonator, and the thickness of the piezoelectric substrate, the cutting angle, and the widths and the depths of the mass portion and the groove portion are set such that the frequency-temperature characteristics represent third-order characteristics with respect to the temperature.

According to the above-described piezoelectric resonator element (tuning fork type piezoelectric resonator element), the spindle portion is formed in the tip end portion of each vibrating arm, and the mass portions having a heavy mass are arranged on both sides along the resonator center in the spindle portion so as to be symmetrical. Further, respective groove portions are formed on the front and rear faces along the resonator center in the vibrating arms. By configuring as such, the flexural resonator and the torsional resonator excited in the turning fork type piezoelectric resonator element approach each other so as to be combined together. By appropriately setting the thickness of the piezoelectric substrate, the cutting angle, and the shapes of each mass portion and each groove portion, the frequency-temperature characteristics of the flexure resonator as the principal resonator of the flexure-torsional combined resonator represent third-order characteristics with respect to the temperature, and accordingly, there is an advantage of acquiring the piezoelectric resonator element that has superior temperature characteristics and has a small size.

Application Example 13

This application example is directed to the piezoelectric resonator element according to Application Example 12, wherein the cutting angle of the piezoelectric substrate is set to be in the range of 0 degree to −15 degrees in accordance with the rotation of the electric axis.

The piezoelectric resonator element (tuning fork type piezoelectric resonator element) is configured in which the cutting angle of the piezoelectric substrate is rotated in the range of 0 degree to −15 degrees in accordance with the rotation around the electric axis (the X axis). By setting the cutting angle as such and appropriately setting the thickness of the piezoelectric substrate and the like, the first-order coefficient and the second-order coefficient of a polynomial representing the frequency-temperature characteristics of the principal resonator of the flexure-torsional combined resonator can be set to approximate zero, and accordingly, there is an advantage of acquiring the piezoelectric resonator element having superior temperature characteristics.

Application Example 14

This application example is directed to the piezoelectric resonator element according to Application Example 12 or 13, wherein each spindle portion forms a concave portion in the center portion of the tip end edge by including notch portions that are symmetrical with respect to the resonator center.

By disposing the notch portions that are symmetrical with respect to the resonator center in the center portion of the tip end edge of each spindle portion, the flexural resonator (tuning fork resonator) and the torsional resonator excited in the piezoelectric resonator element can approach each other so as to combined together. By appropriately setting the parameters, there is an advantage of configuring the frequency-temperature characteristics of the flexural resonator of the flexure-torsional combined resonator to have third-order characteristics.

Application Example 15

This application example is directed to the piezoelectric resonator element according to Application Example 14, wherein through holes that are symmetrical with respect to the resonator center are formed within the plane of the spindle portion closer to the vibrating arm than the notch portion.

The spindle portions are reinforced by decreasing the size of the notch portion, arranging the mass portions to be symmetrical with respect to the resonator center on both sides thereof together with the through holes, and arranging the bridging portion between both mass portions. At the same time, the flexural resonator (tuning fork resonator) and the torsional resonator can approach each other so as to be combined together. Furthermore, by appropriately setting the parameters, there is an advantage of configuring the frequency-temperature characteristics of the flexural resonator of the flexure-torsional combined resonator to represent third-order characteristics.

Application Example 16

This application example is directed to the piezoelectric resonator element according to Application Example 12 or 14, wherein each spindle portion includes through holes that are symmetrical with respect to the resonator center in the center portion of the area.

By arranging the through hole in the center portion, while the rigidity of the spindle portion is increased, the change in the frequency of the flexural resonator slightly decreases. However, by slightly increasing the area of the through hole, the decrease in the frequency can be supplemented. Even in such a case, the frequencies of the flexural resonator (tuning fork resonator) and the torsional resonator can approach each other so as to be combined together. In addition, by appropriately setting the parameters, there is an advantage of configuring the frequency-temperature characteristics of the flexural resonator of the flexure-torsional combined resonator to represent third-order characteristics.

Application Example 17

This application example is directed to the piezoelectric resonator element according to Application Example 12 or 13, wherein each spindle portion includes a through hole that is symmetrical with respect to the resonator center at the side end of the base portion, and the through hole is connected to the groove portion of each vibrating arms.

By disposing the through hole at the side end of the base portion of the spindle portion, although the change in the frequency of the flexural resonator slightly decreases, by extending the groove portion of the vibrating arm, the frequency of the torsional resonator decreases, whereby two frequencies of the flexural resonator and the torsional resonator can approach each other so as to be combined together. In addition, by appropriately setting the parameters, there is an advantage of configuring the frequency-temperature characteristics of the flexural resonator of the flexure-torsional combined resonator to represent third-order characteristics.

Application Example 18

This application example is directed to the piezoelectric resonator element according to any one of Applications 12 to 17, wherein the base portion includes a base portion main body, a connecting portion arranged in the center portion of the other end edge of the base portion main body that is located on a side opposite to the vibrating arm, and one pair of left and right support arms that are connected through the connecting portion and extend so as to be separated from the base portion main body.

The base portion of the piezoelectric resonator element (tuning fork type piezoelectric resonator element) includes the base portion main body, the connecting portion, the "L"-shaped support arm, and the reverse "L"-shaped support arm. In the base portion, the end portions of the "L" shape and the reverse "L" shape are connected together, and the connection portion is configured to be connected to the center of one end portion of the base portion main body through the connecting portion. Accordingly, the resonator energy leaking to the support arms from the vibrating arms can be reduced, whereby the CI value is small, and the impact is alleviated by the structure of the base portion so as to improve impact resistance. As a result, there is an advantage of acquiring a piezoelectric resonator element having no problem of frequency variations due to a damage, a destruction, or the like that is caused by an impact.

Application Example 19

This application example is directed to a piezoelectric resonator including: the piezoelectric resonator element according to any one of Application Examples 12 to 18; and a package that houses the piezoelectric resonator element.

The flexural resonator and the torsional resonator excited in the above-described piezoelectric resonator element (tuning fork type piezoelectric resonator element) are configured to approach each other, and the tuning fork type piezoelectric resonator element in which the flexure-torsional combined resonator is excited is housed in an insulating substrate, whereby the piezoelectric resonator is configured. As a result, there is an advantage of acquiring a piezoelectric resonator that has a high Q value due to its small size and has superior shock resistance and superior frequency-temperature characteristics.

Application Example 20

This application example is directed to a piezoelectric oscillator including: the piezoelectric resonator element according to any one of Application Examples 12 to 18; an IC component in which an oscillation circuit that excites the piezoelectric resonator element is mounted; and a package that seals the piezoelectric resonator element in an air-tight manner and houses the IC component.

By configuring the piezoelectric oscillator that includes: the piezoelectric resonator element (tuning fork type piezoelectric resonator element) in which the flexural resonator and the torsional resonator are approached each other the flexure-torsional combined resonator is excited; the IC component that oscillates the piezoelectric resonator element, and the package housing them, there is an advantage of acquiring a piezoelectric oscillator that has a small size and superior frequency-temperature characteristics.

Application Example 21

This application example is directed to a resonator gyro element including: a base portion; one pair of detecting vibrating arms that protrude from two end edges of the base portion, which face each other, on the same line; one pair of connecting arms that protrude from the other two end edges of the base portion, which face each other, on the same line in a direction perpendicular to the detecting vibrating arms; one pair of driving vibrating arms that protrude from the end portion of each connecting arm in both directions perpendicular thereto; and excitation electrodes that are formed in at least the one pair of detecting vibrating arms and the one pair of driving vibrating arms and are electrically connected between a plurality of electrode pads disposed in the base portion. Each driving vibrating arm includes a groove portion that extends in a linear shape along the longitudinal direction of each vibrating arm on the front and rear faces and a spindle portion having a width larger than that of each vibrating arm in the tip end portion. Each spindle portion includes mass portions that are symmetrical with respect to the resonator center on both sides thereof, the flexural resonator of the flexure-torsional combined resonator excited in the driving vibrating arm is configured as the principal resonator, and the cutting angle of the substrate of the resonator gyro element and the widths and the depths of the mass portion and the groove portion are set such that the frequency-temperature characteristics represent third-order characteristics with respect to the temperature.

The resonator gyro element is configured in which each spindle portion is formed in the tip end portion of each driving vibrating arm, a notch portion is formed to be symmetrical with respect to the resonator center along the longitudinal direction of the vibrating arm in the spindle portion, and groove portions are formed on the front and rear faces of each driving vibrating arm along the resonator center. By configuring as such, the frequency-temperature characteristics of the flexural resonator that is the principal resonator of the flexure-torsional combined resonator excited in each driving vibrating arm represent third-order characteristics with respect to the temperature, and accordingly, there is an advantage of acquiring a resonator gyro element having superior temperature characteristics and having a small size.

Application Example 22

This application example is directed to a resonator gyro sensor including the resonator gyro element according to Application Example 21 and a package that houses the resonator gyro element.

By configuring the resonator gyro sensor by housing the resonator gyro element in the package, the frequency-temperature characteristics of the principal resonator of the flexure-torsional combined resonator excited in each driving vibrating arm are improved, and, by arranging the spindle portion, there is an advantage of acquiring a small-size resonator gyro sensor.

Application Example 23

This application example is directed to an electronic apparatus that includes: the piezoelectric resonator according to Application Example 19 or the resonator gyro sensor according to Application Example 22.

By configuring an electronic apparatus including the above-described piezoelectric resonator, there is an advantage of improving the stability of the frequency source of the electronic apparatus. In addition, by configuring an electronic apparatus including the above-described resonator gyro sensor, there is an advantage of reducing the change in the sensitivity of the angular velocity for the temperature.

By configuring the resonator gyro sensor as above, the frequency-temperature characteristics of the principal resonator of the flexure-torsional combined resonator excited in each driving vibrating arm are improved, and, by arranging the spindle portion, there is an advantage of acquiring a small-size resonator gyro sensor.

Application Example 24

This application example is directed to an electronic apparatus that includes: the piezoelectric resonator according to Application Example 8 or the resonator gyro sensor according to Application Example 11.

By configuring an electronic apparatus including the piezoelectric resonator as above, there is an advantage of improving the stability of the frequency source of the electronic apparatus. In addition, by configuring an electronic apparatus including the above-described resonator gyro sensor, there is an advantage of reducing the change in the sensitivity of the angular velocity for the temperature.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
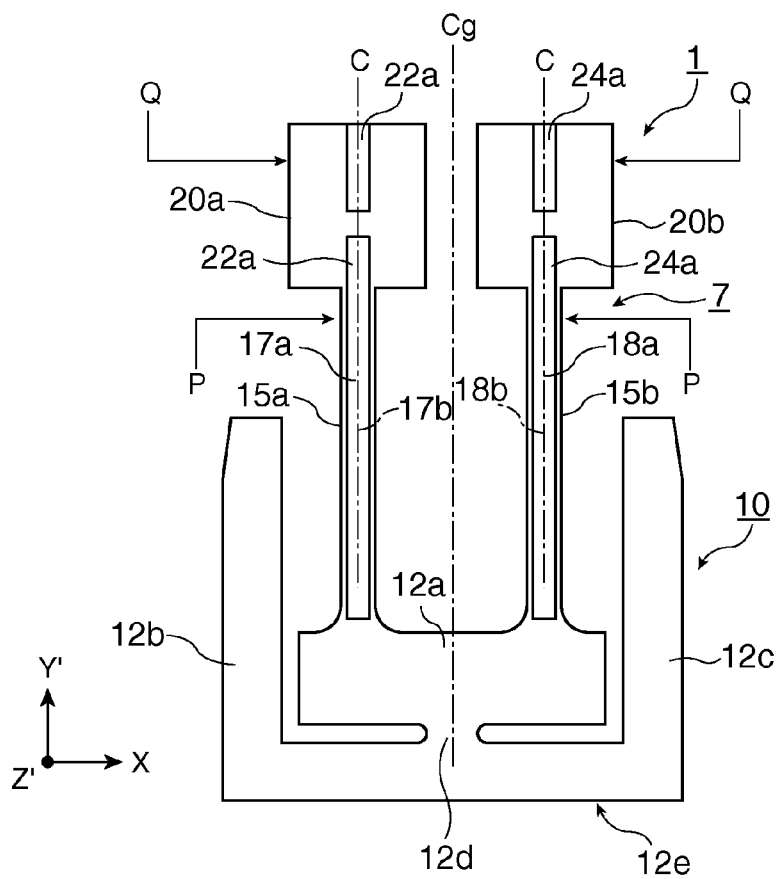
FIG. 1A is a schematic plan view showing the structure of a piezoelectric resonator element according to an embodiment of the invention.

Hereinafter, embodiments of the invention will be described in detail with reference to the drawings. FIG. 1A is a schematic plan view showing the structure of a piezoelectric resonator element (tuning fork type quartz crystal element) 1 according to an embodiment of the invention. The piezoelectric resonator element 1 includes a piezoelectric substrate 7 that has a flat plate shape and thin-film electrodes 25 that are formed on the front and rear faces and the side face of the piezoelectric substrate 7.

The piezoelectric substrate 7, as shown in FIG. 1A, includes: a plurality of (two in this example) vibrating arms 15a and 15b, which have a narrow band shape, extending side by side (in parallel with each other) in a linear shape; a base portion 10 that connects one end portions (base end portions) of the vibrating arms 15a and 15b; spindle portions 20a and 20b that are integrally formed so as to be connected to the other end portions (tip end portions) of the vibrating arms 15a and 15b and are wider than the width of the other end portions of the vibrating arms 15a and 15b; and second groove portions 17a (17b) and 18a (18b) formed on the front and rear faces along the resonator center line C of the vibrating arms 15a and 15b.

The spindle portions 20a and 20b include bottomed first groove portions 22a (22b) and 24a (24b) that extend in a linear shape along the longitudinal direction (a direction extending along a segment joining one end portion and the other end portion of the vibrating arm) of the vibrating arms 15a and 15b on at least one (both faces in this example) of the front and rear faces along the resonator center line C. In FIGS. 2 and 3A to 3C, reference numerals 22b and 24b represent the first groove portions formed on the rear face of the spindle portions 20a and 20b.

Here, the resonator center line C is a line that passes through the center of gravity of the vibrating arm and extends in the longitudinal direction of the vibrating arm.

Figure 1B:
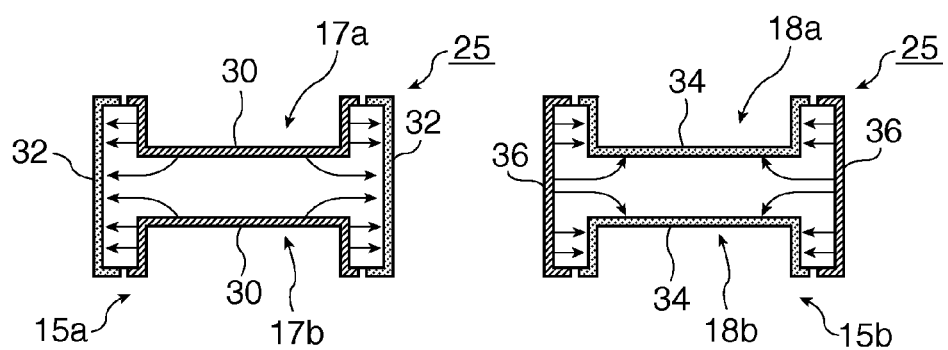
FIG. 1B is a cross-sectional view of a vibrating arm.

The thin film electrode 25 shown in FIG. 1B includes front and rear faces of the spindle portions 20a and 20b, first groove portions 22a, 22b, 24a, and 24b, and excitation electrodes 30, 32, 34, and 36 that are, as shown in FIG. 1B, formed on the front and rear faces and the side faces of the vibrating arms 15a and 15b including the insides of the second groove portions 17a (17b) and 18a (18b) and are electrically connected between a plurality of electrode pads (not shown in the figure) disposed in the base portion 10 through lead electrodes (not shown in the figure). The thin film electrode 25 is formed inside a vacuum device by using a deposition method or a sputtering method. In addition, in a case where the function of the spindle portions 20a and 20b is achieved by only attaching high-density metal such as gold Au to the inside of the first groove portions 22a, 22b, 24a, and 24b, the electrodes do not necessarily need to be formed on the flat surface of the spindle portions 20a and 20b.

In order to decrease resonator leakage and improve shock resistance, the base portion 10 shown in FIG. 1A includes: a base portion main body 12a; a narrow connection portion 12d disposed in the other end edge center portion (the other end located on a side facing one end connected to the vibrating arm) of the base portion main body 12a that is located on a side opposite to the vibrating arms 15a and 15b; and one pair of left and right support arms 12b and 12c that extend in the longitudinal direction with the vibrating arms 15a and 15b interposed therebetween from the front side extending along the widthwise direction in a state in which the support arms are connected through the connection portion 12d and are separated from the base portion main body 12a. In other words, in the example of the base portion, the base end portion of the support arm 12b having an "L" shape and the base end portion of the support arm 12c having a reverse "L" shape are connected together, the connection portion is connected to one end edge center of the base portion main body 12a through the connection portion 12d so as to form the shape of "U", and the base end portions of the vibrating arms 15a and 15b are connected to the other end edge of the base portion main body 12a.

In the embodiment shown in FIGS. 1A and 1B, although the base portion 10 has been described to include the base portion main body 12a, the connection portion 12d, and one pair of the left and right support arms 12b and 12c, only the base portion main body 12a may be included.

In addition, the vibrating arms 15a and 15b extend from the end portion of the base portion main body 12a so as to be parallel to each other with a gap interposed therebetween, and, in the tip end portions of the vibrating arms 15a and 15b, spindle portions 20a and 20b wider than the width of the other end portions of the vibrating arms 15a and 15b are disposed so as to be integrated.

As the piezoelectric substrate 7, for example, in a case where a quartz crystal substrate is used, a substrate that is acquired by cutting out a Z substrate (a substrate cut out so as to be perpendicular to the optical axis (Z axis)) by rotating the electric axis (X axis) by 0° to −15° is used. In addition, the outer shape of the piezoelectric substrate 7, the first groove portions 22a, 22b, 24a, and 24b of the spindle portions 20a and 20b, and the second groove portions 17a (17b) and 18a (18b) of the vibrating arms 15a and 15b are formed through etching processing using a photolithographic technology.

FIG. 1B is a cross-sectional view of FIG. 1A taken along line P-P and is a diagram showing the arrangement of the excitation electrodes 30, 32, 34, and 36 formed in the vibrating arms 15a and 15b. The excitation electrodes 30 and 34 are formed on the front and side faces of the groove portions 17a (17b) and 18a (18b), and the excitation electrodes 32 and 36 are formed on both side faces of the vibrating arms 15a and 15b.

The excitation electrodes 30 and 36 and the excitation electrodes 32 and 34 are applied with voltages having opposite signs through the above-described electrode pads. In other words, when positive voltages are applied to the excitation electrodes 30 and 36, negative voltages are applied to the excitation electrodes 32 and 34, and electric fields as denoted by arrows shown in FIG. 1B are generated, whereby tuning fork type resonator (flexural resonator) that is symmetrical to the center line Cg passing through the center of gravity of the piezoelectric resonator element 1 is excited.

In addition, by forming the groove portions 17a (17b) and 18a (18b), the intensities of the electric fields are strong, whereby the tuning fork type resonator can be excited more efficiently. In other words, the CI (crystal impedance) of the piezoelectric resonator element can be configured to be low.

Figure 2:
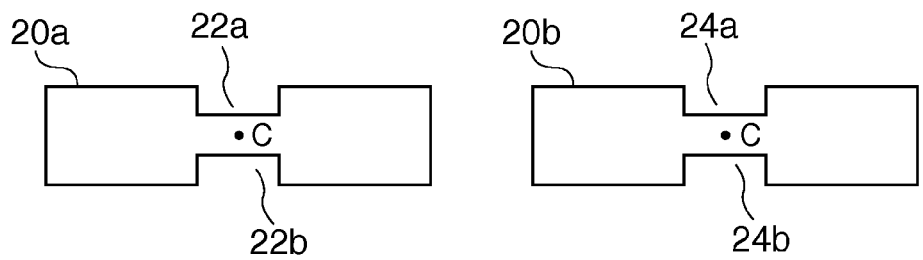
FIG. 2 is a cross-sectional view of a spindle portion disposed in a tip end portion of the vibrating arm.

FIG. 2 is a cross-sectional view of FIG. 1A taken along line Q-Q. The spindle portions 20a and 20b, as shown in the plan view of FIG. 1A and the cross-sectional view of FIG. 2, have a rectangular flat plate shape, and the first groove portions 22a, 22b, 24a, and 24b are arranged to be separated from each other in both end portions of each one of the spindle portions 20a and 20b in the longitudinal direction of the vibrating arms 15a and 15b, have line symmetry with respect to the resonator center line C, and include a tip end-side first groove and a base end-side first groove portion.

Figure 3A:
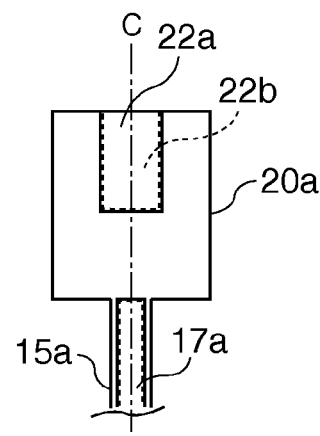
FIGS. 3A to 3C are plan views showing modified examples of the spindle portion.
Figure 3B:
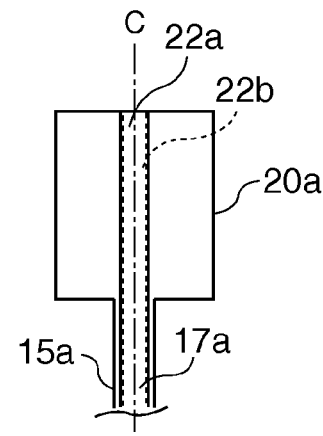
Figure 3C:
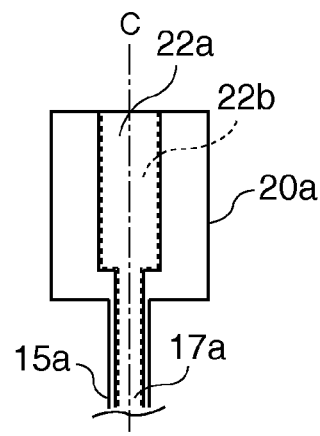

FIGS. 3A to 3C are plan views showing a modified example of the first groove portions 22a, 22b, 24a, and 24b. As shown in FIG. 1A, since the spindle portions 20a and 20b have the same shape, one spindle portion 20a will be described. The first groove portion 22a (22b) shown in FIG. 3A extends from the tip end edge of the spindle portion 20a in the longitudinal direction of the vibrating arm 15a over the center portion in the longitudinal direction and is formed to have line symmetry with respect to the resonator center line C.

In the first groove portion 22a (22b) shown in FIG. 3B, the base end portion of the first groove portion 22a (22b) is formed to be continuous to the tip end portion of the second groove portion 17a (17b), and the tip end portion of the first groove portion 22a (22b) extends up to the tip end edge of the spindle portion 20a and is formed to have line symmetry with respect to the resonator center line C.

The width of at least a part of the first groove portion 22a (22b) shown in FIG. 3C is formed to be wider than the width of the second groove portion 17a (17b).

In the piezoelectric resonator element 1, flexural resonator that is symmetrical with respect to the center line Cg in the direction of the vibrating arms 15a and 15b and torsional resonator that is symmetrical with respect to the center line Cg, which pass the center of gravity, are excited. By appropriately forming the excitation electrode, the resonator mode to be principal resonator can be selected. FIG. 1A to 1C show an example in which tuning fork resonator (flexural resonator) is configured as a principal resonator mode.

As an example of a piezoelectric resonator element according to the embodiment of the invention, a piezoelectric resonator element 1 is formed by using a substrate acquired by cutting out a quartz crystal Z substrate by rotating the electric axis (X axis) by θ (the range from 0 degree to −15 degrees). In the vibrating arms 15a and 15b, the second groove portions 17a, 17b, 18a, and 18b are formed, and, on the front and rear faces of the spindle portions 20a and 20b disposed in the tip end portions of the vibrating arms 15a and 15b, the first groove portions 22a, 22b, 24a, and 24b are formed.

In other words, by appropriately selecting the cutting angle θ, the first groove portions 22a, 22b, 24a, and 24b, and the second groove portions 17a, 17b, 18a, and 18b, two resonator modes are combined by approaching the resonance frequencies $f_F$ and $f_T$ of the flexural resonator (tuning fork resonator) and the torsional resonator excited in the piezoelectric resonator element 1, whereby a tuning fork-type resonator element is configured of which the frequency-temperature characteristics of the flexural resonator of the principal resonator are improved and the size is decreased.

Now, units that allow the resonance frequencies $f_F$ and $f_T$ of the flexural resonator and the torsional resonator of the piezoelectric resonator element according to the embodiment of the invention to approach each other will be described with reference to FIGS. 4A to 4C.

Figure 4A:
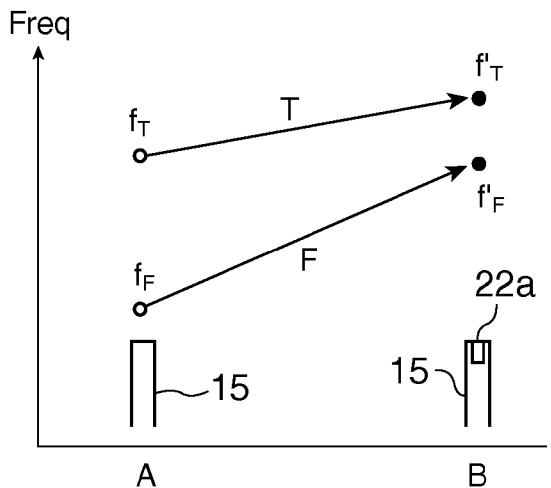
FIG. 4A is an explanatory diagram showing changes in the frequencies of the flexural resonator and the torsional resonator in a case where a groove is formed in the tip end portion of a beam.
Figure 4B:
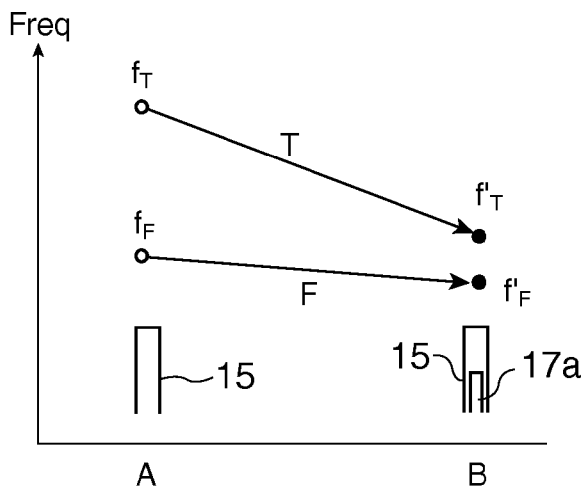
FIG. 4B is an explanatory diagram showing changes in the frequencies of the flexural resonator and the torsional resonator in a case where a groove is formed in a center portion of the beam.
Figure 4C:
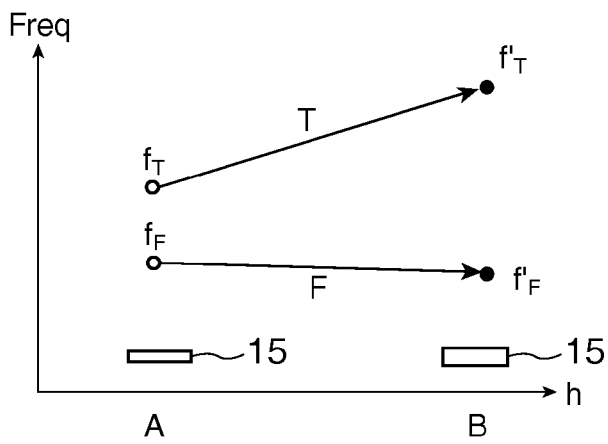
FIG. 4C is an explanatory diagram showing changes in the frequencies of the flexural resonator and the torsional resonator in a case where the plate thickness of the beam is changed.

FIGS. 4A to 4C are diagrams qualitatively illustrating the changes in the resonance frequency $f_F$ of the flexural resonator and the resonance frequency $f_T$ of the torsional resonator, which are excited in the piezoelectric resonator element (tuning fork-type piezoelectric resonator element), according to the first groove portions 22a (22b) and 24a (24b) of the spindle portions 20a and 20b, the second groove portions 17a and 17b of the vibrating arms 15a and 15b, and the thickness h of the vibrating arms 15a and 15b. In addition, A and B denoted in the horizontal axis in FIGS. 4A and 4B represent the shapes of the beam (vibrating arm) 15, A represents a case before a groove is formed in the beam 15, and B represents a case where a groove is formed. FIG. 4C is a case where the plate thickness of the beam 15 is changed.

Here, the resonance frequencies of the flexural resonator and the torsional resonator exited in the beam 15 before formation of a groove portion are denoted by $f_F$ and $f_T$, and the resonance frequencies in a case where a groove portion 22a (22b) is formed in the tip end portion 15 of the beam 15 are denoted by $f'_F$ and $f'_T$. As shown in FIG. 4A, in a case where the groove portion 22a (22b) is formed in the tip end portion of the beam (vibrating arm) 15, while both the resonance frequencies $f'_F$ and $f'_T$ of the flexural resonator and the torsional resonator rise, the degree $df_F=(f'_F-f_F)$ of increase in the frequency of the flexure resonator is higher than the degree $df_T=(f'_T-f_T)$ of increase in the frequency of the torsional resonator.

On the other hand, as shown in FIG. 4B, in a case where the groove portion 17a (17b) is formed in the center portion of the beam (vibrating arm) 15, while the resonance frequencies $f'_T$ and $f'_F$ of the torsional resonator and the flexural resonator fall, the degree $df_T=(f_T-f'_T)$ of decrease in the frequency of the torsional resonator is higher than the degree $df_F=(f_F-f'_F)$ of decrease in the frequency of the flexural resonator.

In addition, as shown in FIG. 4C, in a case where the plate thickness h of the beam 15 is increased, while the frequency $f'_F$ of the flexural resonator is slightly lower than the original frequency $f_F$, the resonance frequency $f'_T$ of the torsional resonator is higher than the original frequency $f_T$.

As above, by appropriately selecting the position of the groove portion formed in the beam (vibrating arm) 15 and the thickness of the beam (vibrating arm) 15, the resonance frequencies of the flexural resonator and the torsional resonator can be allowed to approach each other.

Figure 5A:
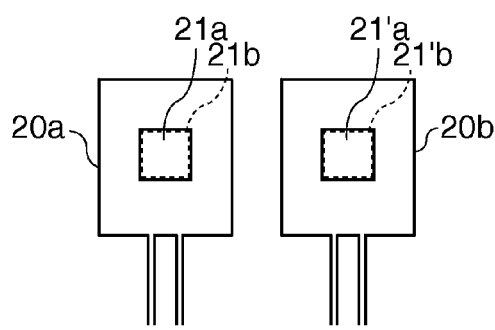
FIGS. 5A and 5B are plan views in a case where concave portions are formed on the front and rear faces of the spindle portion.
Figure 5B:
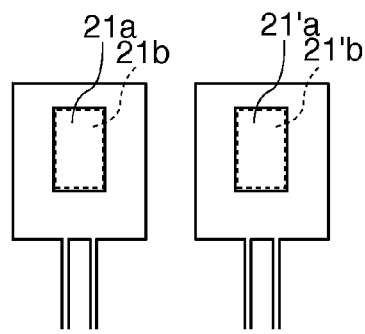
Figure 5C:
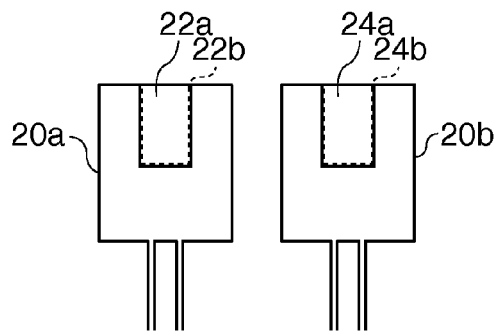
FIG. 5C is a plan view in a case where grooves are formed on the front and rear faces of the tip end portion of the spindle portion.

FIGS. 5A to 5C are plan views of the spindle portions 20a and 20b in a case where only a concave portion and a groove portion formed on the front and rear faces of the spindle portions 20a and 20b are changed without changing the outer shape of the piezoelectric resonator element 1. FIGS. 5A and 5B are examples in which concave portions 21a (21b) and 21'a (21'b) facing each other so as to have line symmetry with respect to the resonator center line C are formed in the center portions of the front and rear faces of the spindle portions 20a and 20b along the longitudinal direction of the vibrating arms 15a and 15b. The areas of the concave portion 21a (21b) and 21'a (21'b) shown in FIG. 5B are formed to be larger than the areas of the concave portions 21a (21b) and 21'a (21'b) shown in FIG. 5A. FIG. 5C is an example in which groove portions 22a (22b) and 24a (24b) are formed so as to have line symmetry with respect to the resonator center line C along the longitudinal direction of the vibrating arms 15a and 15b from the tip end over the center portion on the front and rear faces of the spindle portions 20a and 20b.

Figure 6:
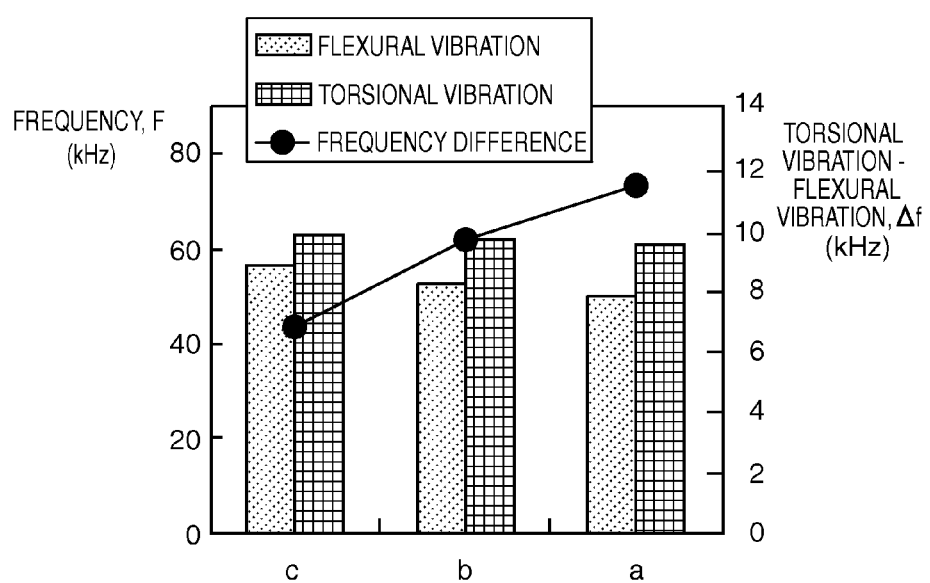
FIG. 6 is a diagram showing the resonance frequencies of the flexural resonator and the torsional resonator and a resonance frequency difference ($\Delta f$) corresponding to each of the piezoelectric resonator elements shown in FIGS. 5A-5C.

FIG. 6 is a diagram showing the resonance frequencies $f_F$ and $f_F$ of the flexural resonator and the torsional resonator of the piezoelectric resonator element 1 including the spindle portions 20a and 20 having the shapes shown in FIGS. 5A to 5C and a difference frequency $\Delta f=(f_T-f_F)$ that are acquired through simulations using a finite element method. In the figure, the left side of the vertical axis represents the resonance frequencies $f_F$ and $f_T$, and the right side of the vertical axis represents the difference frequency $\Delta f$. In addition, the horizontal axis represents reference signs a, b, and c in correspondence with the piezoelectric resonator element 1 including the spindle portions 20a and 20 having the shapes shown in FIGS. 5A to 5C.

When the resonance frequencies of a and b shown in FIG. 6 are compared with each other, it is understood that, as the area of the concave portions is increased, the difference frequency $\Delta f$ decreases in a case where the sizes of the concave portions of the spindle portions 20a and 20b are changed without changing the outer shape of the piezoelectric resonator element 1. As shown in FIG. 4A, this can be described also based on that, as the mass of the tip end portion of the beam (vibrating arm) 15 is decreased, the increase in the frequency of the flexural resonator is larger than the increase in the frequency of the torsional resonator, and the difference frequency $\Delta f=(f_T-f_F)$ decreases. In addition, it can be described based on FIG. 4A that the frequency of the flexural resonator of b is higher than the frequency of the flexural resonator of a.

In addition, c shown in FIG. 6 is an example in which groove portions 22a (22b) and 24a (24b) are formed in the tip end portions of the spindle portions 20a and 20b, and it is presented that the difference frequency $\Delta f=(f_T-f_F)$ can be described further. By configuring the difference frequency $\Delta f=(f_T-f_F)$ to be small, for example, by configuring the value of $\Delta f/((f_T-f_F)/2)$ to be 10% or less, the combination of the flexure resonator and the distortion resonator is dense, and the frequency-temperature characteristics of the flexure resonator as the principal resonator are improved.

Figure 7A:
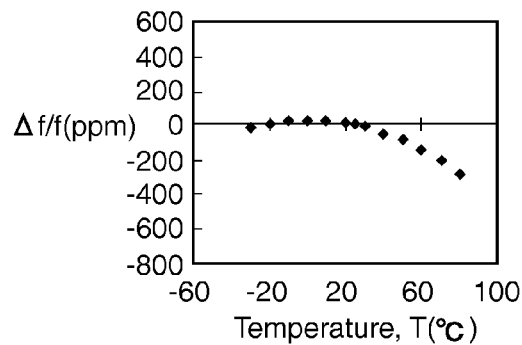
FIG. 7A is a diagram showing the frequency-temperature characteristics of the tuning fork resonator (flexural resonator)
Figure 7B:
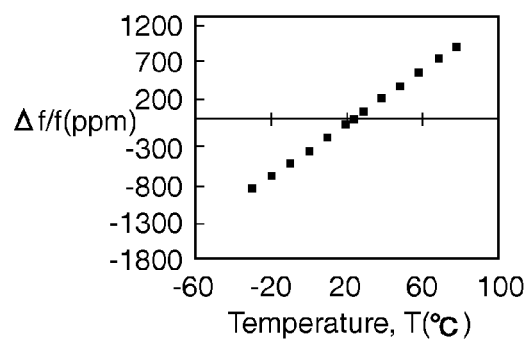
FIG. 7B is a diagram showing the frequency-temperature characteristics of the torsional resonator.
Figure 7C:
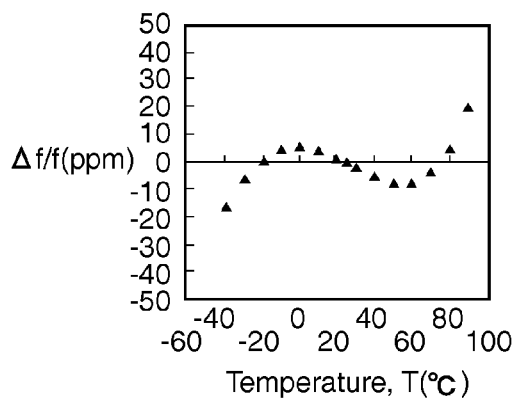
FIG. 7C is a diagram showing the frequency-temperature characteristics of the flexure-torsional combined resonator.

FIGS. 7A to 7C qualitatively illustrate the appearance of improving the frequency-temperature characteristics of flexural resonator of principal resonator by combining the flexural resonator and torsional resonator excited in the piezoelectric resonator element 1, by using diagrams. Generally, the frequency-temperature characteristics $\Delta f/f$ ($=(f-f_0)/f$, here, $f_0$ is a frequency at predetermined temperature) can be represented in a polynomial of temperature T as shown in Equation (1).

$$\Delta f/f = \alpha(T-T_0) + \beta(T-T_0)^2 + \gamma(T-T_0)^3 + \ldots \quad (1)$$

FIG. 7A shows a quadratic curve with respect to temperature T as the frequency-temperature characteristics of the flexural resonator that is the principal resonator. FIG. 7B shows the frequency-temperature characteristics of the torsional resonator, and a frequency $\Delta f/f$ is approximated to a first-order equation with respect to temperature T. FIG. 7C is a diagram showing the frequency-temperature characteristics of the flexural resonator as the principal resonator in a case where the flexure resonator and the torsional resonator are combined. By combining the torsional resonator with the flexural resonator as the principal resonator, the first-order coefficient $\alpha$ and the second-order coefficient $\beta$ of the polynomial $\Delta f/f$ representing the frequency-temperature characteristics of the flexural resonator can be configured to be almost zero, and the frequency-temperature characteristics of the flexural resonator of the principal resonator can be approximated by a third-order coefficient $\gamma$ so as to represent a cubic curve (third-order characteristics) in a desired temperature range including room temperature as shown in FIG. 7C.

Figure 8:
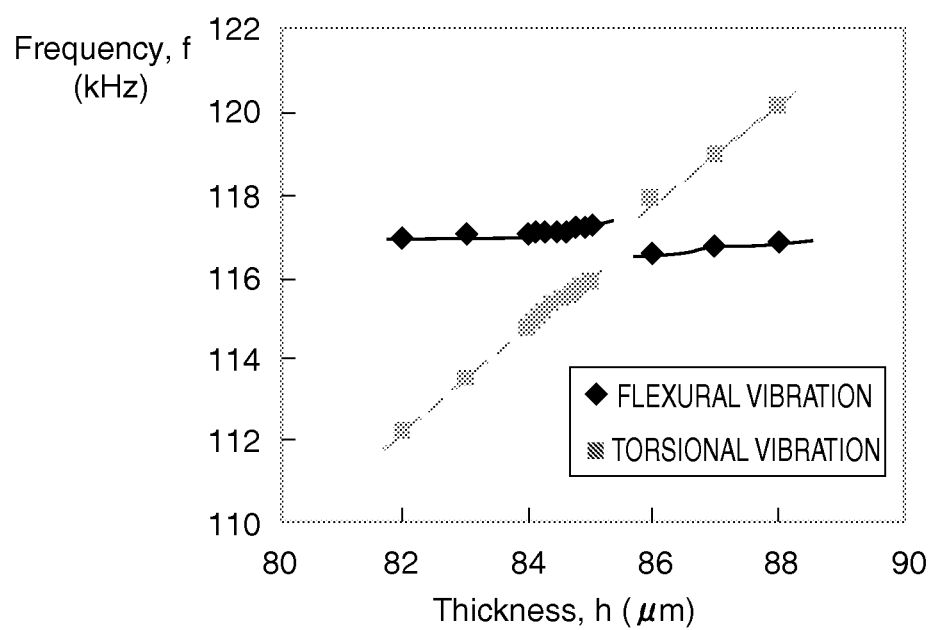
FIG. 8 is a diagram showing a combination of the flexural resonator and the torsional resonator in a case where the plate thickness of the vibrating arm is changed.

FIG. 8 is a diagram representing the degree of combination of the flexural resonator and the torsional resonator acquired through a simulation in a case where the plate thickness h of the vibrating arms 15a and 15b of the piezoelectric resonator element 1 (tuning fork type quartz crystal resonator element) is changed. The resonance frequency $f_F$ of the flexural resonator is approximately flat with respect to the thickness h and slightly decreases in accordance with an increase in the thickness h.

On the other hand, the resonance frequency $f_T$ of the torsional resonator increases in approximately proportional to an increase in the thickness h. In the example shown in FIG. 8, it can be understood that the combination increases at a plate thickness h slightly smaller than 86 μm.

Figure 9A:
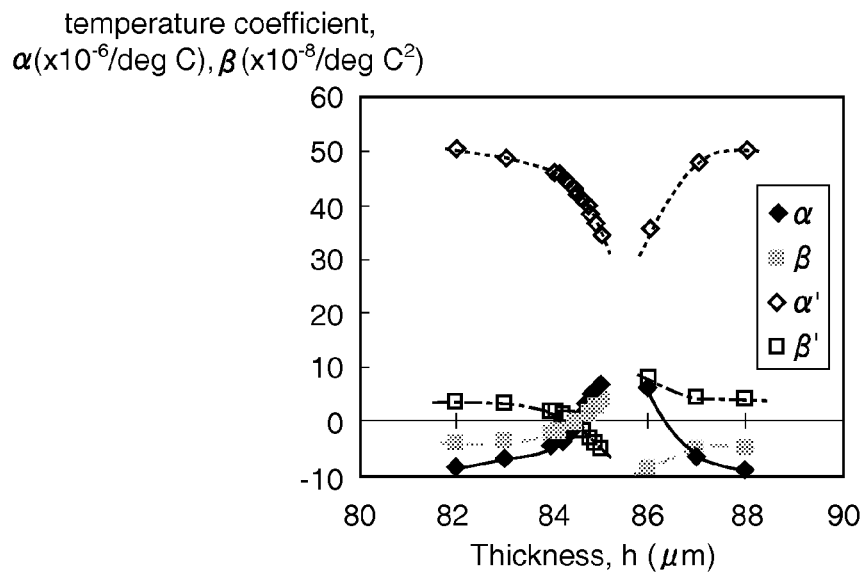
FIG. 9A is a diagram showing the relation among the plate thickness, the first-order coefficients, and the second-order coefficients of the flexural resonator and the torsional resonator in the flexure-torsional combined resonator.

FIG. 9A is a diagram illustrating the first-order coefficient α and the second-order coefficient β of the flexural resonator and the first-order coefficient α' and the second-order coefficient β' of the torsional resonator, which are acquired through a simulation, excited in the piezoelectric resonator element 1. In the figure, the first-order coefficient α and the second-order coefficient β are denoted by a diamond ♦ and a square ■, and the first-order coefficient α' and the second-order coefficient β' of the torsional resonator are denoted by a white diamond ◇ and a white square □. From FIG. 9A, it can be understood that the first-order coefficient α' of the torsional resonator is larger than the other coefficients. In other words, in the torsional resonator, the first-order coefficient α' is dominant.

Figure 9B:
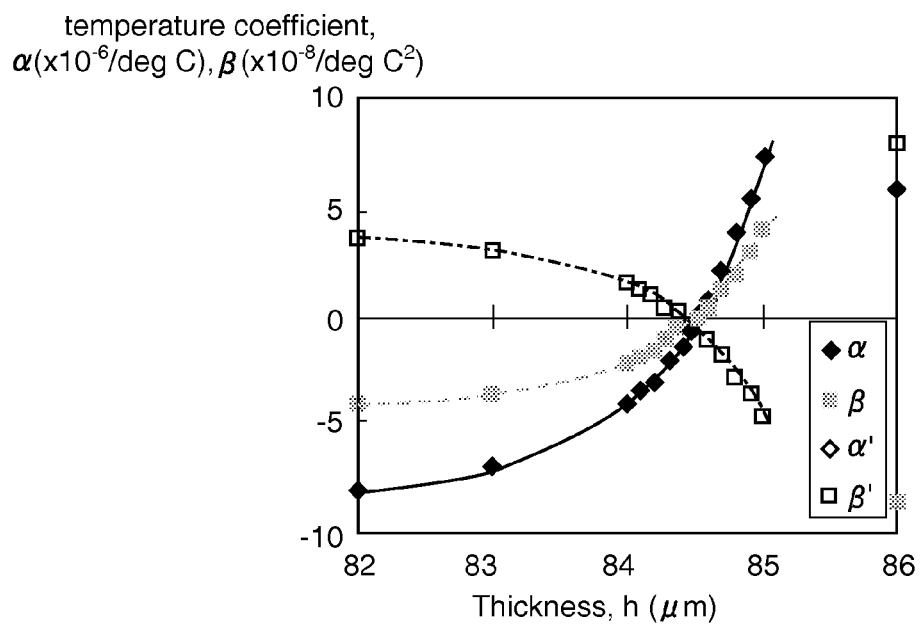
FIG. 9B is an enlarged diagram of a main portion thereof.

In addition, it can be understood that the first-order coefficient α and the second-order coefficient β of the flexural resonator are extremely small in the range of 84 μm to 85 μm as the plate thickness h of the vibrating arms 15a and 15b in the example of FIGS. 9A and 9B.

FIG. 9B is a diagram illustrating the first-order coefficients and the second-order coefficients α, β, α' and, β' of the flexural resonator and the torsional resonator with respect to the plate thickness h in a case where the plate thickness h of the vibrating arms 15a and 15b is changed in the range of 82 μm to 86 μm. In the example of FIG. 9B, it is determined that both the first-order coefficient α and the second-order coefficient β of the flexural resonator are approximately zero near the plate thickness h=84.5 μm. In addition, it can be understood that the second-order coefficient β' of the torsional resonator is approximately zero near the plate thickness h=84.5 μm.

In other words, in the example of the piezoelectric resonator element 1 shown in FIGS. 9A and 9B, by setting the plate thickness h to 84.5 μm, both the first-order coefficient α and the second-order coefficient β of the frequency-temperature characteristics of the flexural resonator as the principal resonator can be zero. Accordingly, the frequency-temperature characteristics of the flexural resonator represent a cubic curve, and the frequency-temperature characteristics are markedly improved. In addition, by arranging the spindle portions 20a and 20b, the vibrating arms are shortened, whereby a small-size piezoelectric resonator element 1 can be acquired.

In addition, by emitting laser beams to the electrodes formed on the front and rear faces of the spindle portions 20a and 20b, the electrodes formed inside the first groove portions 22a, 22b, 24a, and 24b, and the electrodes formed in the vibrating arms 15a and 15b, the degree of combination of the flexural resonator and the torsional resonator excited in the tuning fork type piezoelectric resonator can be delicately adjusted.

Furthermore, when frequency variations due to a falling impact and the like are considered, there is a case where the electrodes for the spindle portions are preferably formed only inside the first groove portions by avoiding the electrodes (particularly, the tip end portions) formed on the front and rear faces of the spindle portion.

As shown in FIGS. 1A and 1B, according to the piezoelectric resonator element (tuning fork type resonator element) 1 according to the embodiment of the invention, the spindle portions are formed in the tip end portions of the vibrating arms, the first groove portions extending in a linear shape along the longitudinal direction of the resonator arms are formed on the front and rear faces of the spindle portions, and the second groove portions are formed on the front and rear faces along the resonator center line of the vibrating arms. By configuring as such, the flexural resonator and the torsional resonator excited in the tuning fork type piezoelectric resonator element 1 are allowed to approach each other and can be combined together. Accordingly, the frequency-temperature characteristics of the flexural resonator as the principal resonator of the flexure-torsional combined resonator have third-order characteristics, whereby there is an advantage that a miniaturized piezoelectric resonator element having superior temperature characteristics can be acquired.

In addition, as shown in FIG. 1A, the base portion of the piezoelectric resonator element (tuning fork type piezoelectric resonator element) 1 includes the base portion main body, the connection portions, and the support arms having an "L" shape and a reverse "L" shape, the end portions of the "L" shape and the reverse "L" shape are connected to each other, and each connection portion is configured to be connected to the center of one end portion of the base portion main body through the connection portion. Accordingly, the resonator energy leaking to the support arms from the vibrating arms can be reduced, whereby the CI value is small, and the impact resistance is improved. As a result, there is an advantage of acquiring a piezoelectric resonator element having no problem of frequency variations due to a damage, a destruction, or the like that is caused by an impact.

The piezoelectric resonator element (tuning fork type piezoelectric resonator element) 1 is configured in which the cutting angle of the piezoelectric substrate 7 shown in FIG. 1A is rotated around the electric axis (X axis) in the range of 0 degree to −15 degrees. By selecting the cutting angle as such, the first-order coefficient and the second-order coefficient of the polynomial representing the frequency-temperature characteristics of the flexure-torsional combined resonator can be configured to be approximately zero, and there is an advantage of acquiring a piezoelectric resonator element having superior temperature characteristics.

In addition, by configuring the piezoelectric resonator element 1 in which the first groove portions 22a to 24b are formed as shown in FIG. 1A, the frequency-temperature characteristics of the flexure resonator of the flexure-torsional combined resonator have third-order characteristics with respect to the temperature, and there are an advantage of acquiring the piezoelectric resonator element having superior temperature characteristics and an advantage of forming the lead electrodes that electrically connect the excitation electrodes on the flat faces of the spindle portions 20a and 20b.

In addition, by configuring the piezoelectric resonator element in which the first groove portions 22a to 24b are formed as shown in FIGS. 3A to 3C, the frequency-temperature characteristics of the principal resonator of flexure-torsional combined resonator represent third-order characteristics with respect to the temperature, and there is an advantage of improving the temperature characteristics. Furthermore, there is an advantage of forming the lead electrodes electrically connecting the excitation electrodes on the flat faces of the spindle portion 20a in the example shown in FIG. 3A, there is an advantage of easily forming masks used for forming the first and second groove portions in the example shown in FIG. 3B, and there is an advantage of easily combining the flexure resonator frequency and the torsional resonator frequency in the example shown in FIG. 3C by appropriately setting the width of the first groove portion.

Figure 10:
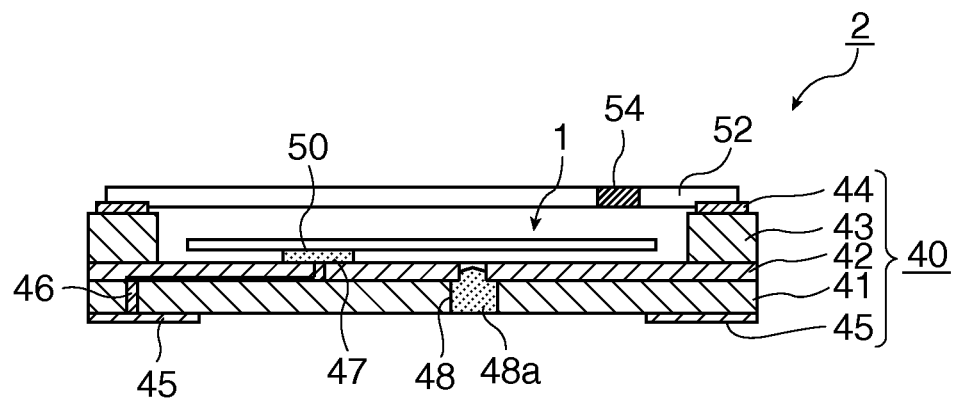
FIG. 10 is a cross-sectional view of a piezoelectric resonator using the flexure-torsional combined resonator.

FIG. 10 is a cross-sectional view showing the configuration of a piezoelectric resonator 2 according to a second embodiment of the invention. The piezoelectric resonator 2 includes the above-described piezoelectric resonator element 1 and a package that houses the piezoelectric resonator element 1. The package is configured by a package main body 40 formed in a rectangular box shape and a lid member 52 having a window member 54 formed from glass or the like.

The package main body 40, as shown in FIG. 10, is formed by laminating a first substrate 41 as an insulating substrate, a second substrate 42, and a third substrate 43, and is formed by molding a ceramic green sheet made of aluminum oxide so as to be in the shape of a box as an insulating material and sintering the molded ceramic green sheet. In addition, a plurality of mounting terminals 45 is formed on the bottom face of the first substrate 41 that is located on the outer side.

In the third substrate 43, the center portion is removed, and, on the upper peripheral edges of the third substrate 43, metal seal rings 44, for example, made from Kovar or the like are formed.

A concave portion housing the piezoelectric resonator element 1 is formed by the third substrate 43 and the second substrate 42. At predetermined positions located on the upper face of the second substrate 42, a plurality of element mounting pads 47 that are electrically connected to the mounting terminals 45 by conductive bodies 46 is disposed.

The positions of the element mounting pads 47 are arranged so as to be in correspondence with pad electrodes (not shown in the figure) formed in support arms 12b and 12c when the piezoelectric resonator element 1 is placed.

In the configuration of the piezoelectric resonator 2, the element mounting pad 47 of the package main body 40 is coated with a conductive bonding agent 50, for example, any one of an epoxy-based bonding agent, a polyimide-based bonding agent, and a bismaleimide-based bonding agent, and the piezoelectric resonator element 1 is placed thereon so as to apply a weight.

Then, in order to harden the conductive bonding agent 50 of the piezoelectric resonator element 1 mounted in the package main body 40, the package main body is placed in a predetermined high-temperature furnace for a predetermined time. After an annealing process is performed, a part of a frequency adjusting metal film formed in spindle portions 20a and 20b and the vibrating arms 15a and 15b is transpired by emitting laser beams from the upper side, whereby coarse frequency adjustment is performed. Then, the lid member 52 including the glass window portion 54 is seam-welded to the seal ring 44 formed on the upper face of the package main body 40.

Before sealing a through hole 48 of the package, a heating process is performed. Then, the package is vertically reversed, and a filler 48a of a metal sphere is placed on a level difference portion located inside the through hole 48. As the filler 48a, a gold-germanium alloy or the like may be used. The filler 48a is melted by emitting laser beams thereto, whereby the through hole 48 is sealed, and the inside of the package is formed to be vacuum. In addition, laser beams are emitted to the inside of the package from the outside of the package through the window member 54, and the frequency adjusting metal film formed in the vibrating arms 15a and 15b is transpired so as to perform delicate frequency adjustment, whereby the piezoelectric resonator 2 is completed.

The transformation of the piezoelectric resonator element 1 that occurs when an impact such as falling is applied to the piezoelectric resonator 2 having the configuration shown in FIG. 10 will be described. When an impact is applied in a direction perpendicular to the principal face of the package of the piezoelectric resonator 2, in the piezoelectric resonator element 1, arm support portions 12b and 12c that can be easily transformed with the element mounting pad 47 used as a point of support are transformed toward the bottom face of the package main body 40. Next, this transformation is reflected to an outer end frame 12e of a base portion 10, and the transformation propagates to the center portion of the base portion main body 12a, whereby the entirety including the base portion main body 12a is sunk to the bottom face side of the package main body 40. As a result, the tip end sides of the vibrating arms 15a and 15b are transformed toward the package bottom face. In other words, in the structure of the base portion 10, by connecting the base portion main body 12a to the support arms 12b and 12c through the connection portions 12d, an impact applied thereto is configured to be alleviated by the structure of the base portion 10.

As shown in the cross-sectional view of FIG. 10, the piezoelectric resonator 2 is configured by allowing the flexural resonator and torsional resonator excited in the tuning fork type piezoelectric resonator element to approach each other and housing the tuning fork type piezoelectric resonator element 1 in which the flexure-torsional combined resonator is excited in an insulating substrate 40, whereby there is an advantage of acquiring a piezoelectric resonator that has a high Q value due to its small size and has superior frequency-temperature characteristics.

Figure 11:
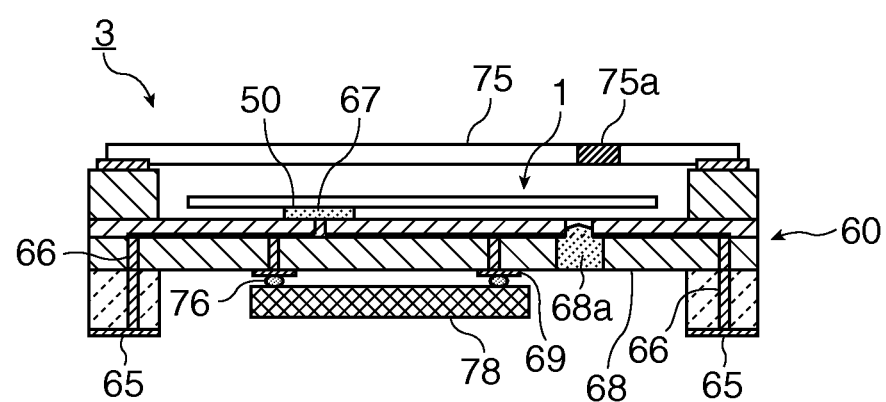
FIG. 11 is a cross-sectional view of a piezoelectric oscillator.

FIG. 11 is a cross-sectional view showing the configuration of a piezoelectric oscillator 3 according to a third embodiment of the invention. The piezoelectric oscillator 3 includes: the above-described piezoelectric resonator element 1; an IC component 78 that excites the piezoelectric resonator element 1; a package main body 60 that seals the piezoelectric resonator element 1 so as to form a vacuum state and houses the IC component 78; and a lid member 75 that includes a window member 75a. The coarse adjustment through emitting laser beams to the piezoelectric resonator element 1, a technique for delicate adjustment, or a technique of sealing the through hole 68 by forming the inside of the package to be in a vacuum state, and the like are similar to those of the piezoelectric resonator 2, and are not described here. The IC component 78 is electrically conducted and connected to the IC component mounting pad 69 of the package main body 60 using a metal bump 76 or the like.

In the piezoelectric oscillator 3 shown in FIG. 11, although an example is shown in which the IC component 78 is not sealed in an air-tight manner, it may be configured such that the IC component 78 is arranged inside the package and is sealed in an air-tight manner.

As shown in the cross-sectional view of FIG. 11, the piezoelectric oscillator is configured so as to include: the tuning fork type piezoelectric resonator element 1 in which the flexural resonator and the torsional resonator approach each other, and the flexure-torsional combined resonator is excited; an IC component 78; and a package 60 that houses the tuning fork type piezoelectric resonator element and the IC component, whereby there is an advantage of acquiring a small-size piezoelectric oscillator having superior frequency-temperature characteristics.

Figure 12A:
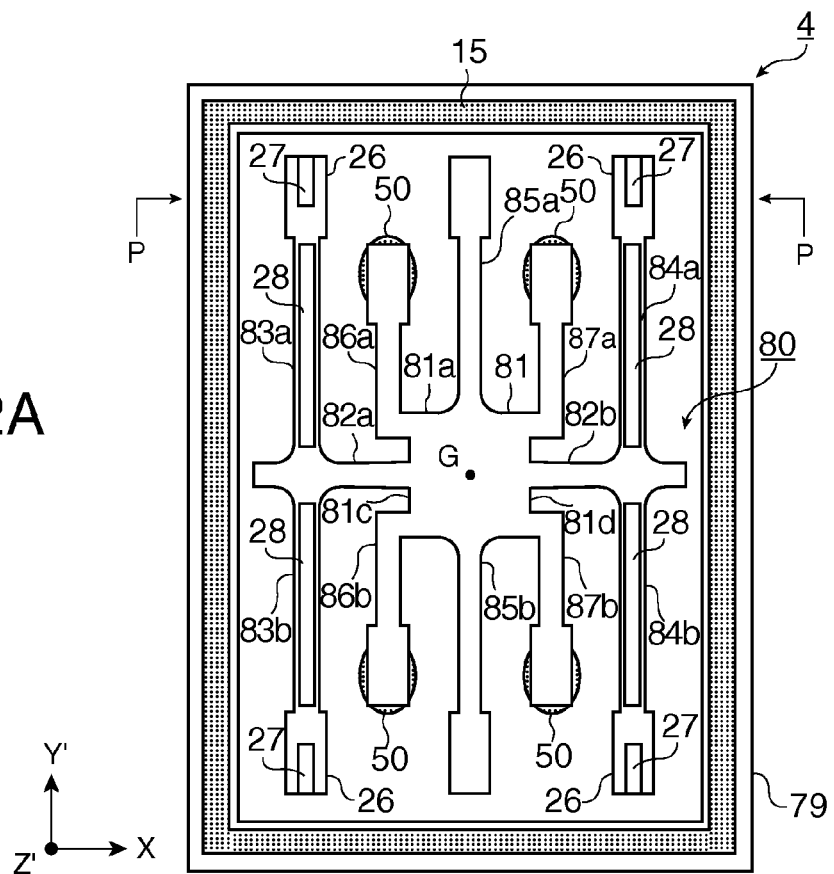
FIG. 12A is a plan view of a resonator gyro sensor.
Figure 12B:
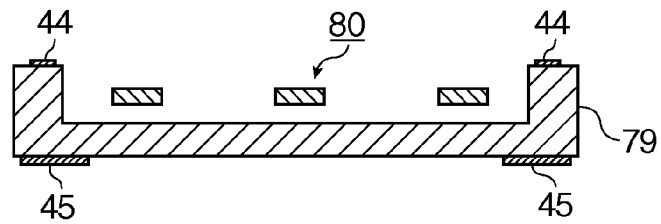
FIG. 12B is a cross-sectional view thereof.
Figure 12C:
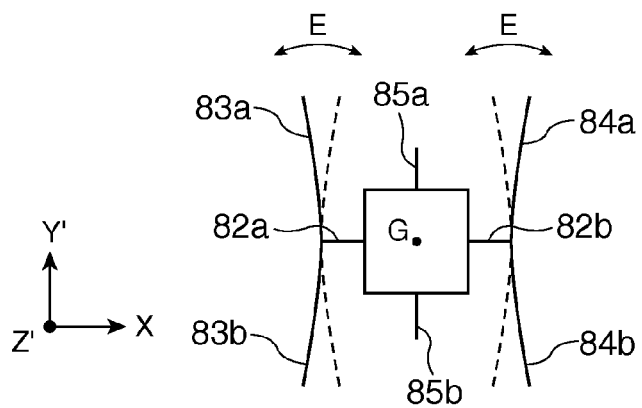
FIG. 12C is a schematic diagram illustrating the operation thereof.

FIGS. 12A to 12C are diagrams showing the configuration of a resonator gyro sensor 4 according to a fourth embodiment of the invention and, in the figures, the lid body is not illustrated. FIG. 12A is a plan view of the resonator gyro sensor 4, and FIG. 12B is a cross-sectional view taken along line P-P.

The resonator gyro sensor 4 includes a resonator gyro element 80 and a package that houses the resonator gyro element 80. The package includes an insulating substrate (package main body) 79 and a lid body that seals the insulating substrate 79 in an air-tight manner.

The resonator gyro element 80 includes a base portion that includes a base portion main body 81 and one pair of detecting vibrating arms 85a and 85b that protrude from two end edges of the base portion main body 81, which face each other, on the same line. In addition, the resonator gyro element 80 includes one pair of first connecting arms 82a and 82b protruding from the other two end edges of the base portion main body 81, which face each other, on the same line in a direction perpendicular to the detecting vibrating arms 85a and 85b and one pair of driving vibrating arms 83a and 83b and one pair of driving vibrating arms 84a and 84b that protrude from the tip end portions of the first connecting arms 82a and 82b in both directions perpendicular thereto.

In addition, the base portion includes one pair of second connecting arms that protrude from the other two end edges of the base portion main body 81, which face each other, on the same line in a direction perpendicular to the detecting vibrating arms 85a and 85b and one pair of support arms 86a and 86b and one pair of support arms 87a and 87b that protrude from the tip end portions of the second connecting arms in both directions perpendicular thereto and are arranged between the detecting vibrating arms 85a and 85b and the driving vibrating arms 83a and 83b and 84a and 84b.

Furthermore, excitation electrodes are formed at least one pair of the detecting vibrating arms 85a and 85b and one pair of the driving vibrating arms 83a and 83b and 84a and 84b. In the support arms 86a and 86b and 87a and 87b, a plurality of electrode pads (not shown in the figure) is formed, and the electrode pads and the excitation electrodes are electrically connected to each other.

FIG. 12C is a schematic plan view showing the operation of the resonator gyro element. The resonator gyro sensor 4, in a state in which an angular velocity is not applied thereto, the driving vibrating arms 83a, 83b, 84a, and 84b perform flexural resonator in a direction denoted by arrow E. At this time, since the driving vibrating arms 83a and 83b and the driving vibrating arms 84a and 84b are vibrated so as to have line symmetry with respect to a line that passes through the center G of gravity and extends in the Y' axis direction, the base portion main body 81, the connecting arms 82a and 82b, and the detecting vibrating arms 85a and 85b hardly vibrate.

When an angular velocity ω for Z' axis rotation is applied to the resonator gyro sensor 4, a Coriolis force works on the driving vibrating arms 83a, 83b, 84a, and 84b, and the first connecting arms 82a and 82b, whereby new resonator is excited. This resonator is resonator in the circumferential direction with respect to the center G of gravity. At the same time, detection resonator is excited in the detecting vibrating arms 85a and 85b in accordance with the resonator. By detecting distortion occurring in accordance with the resonator using the detecting electrodes formed in the detecting vibrating arms 85a and 85b, the angular velocity is acquired.

According to the features of the resonator gyro sensor 4 of the embodiment of the invention, the spindle portions 26 are disposed in the tip end portions of the driving vibrating arms 83a, 83b, 84a, and 84b, and first groove portions 27 are formed on the front and rear face of each spindle portion 26 along the longitudinal direction of the vibrating arms so as to have line symmetry with respect to the resonator center line. In addition, in the driving vibrating arms 83a, 83b, 84a, and 84b, second groove portions 28 are formed along the longitudinal direction of the vibrating arms so as to have line symmetry with respect to the resonator center line. By appropriately selecting the cutting angle θ of the piezoelectric resonator substrate of the resonator gyro element 80 and the first groove portion 27 of the spindle portion 26, the second groove portions 28 of the driving arms 83a, 83b, 84a, and 84b, and the plate thickness of the driving arms 83a, 83b, 84a, and 84b, the resonance frequencies $f_F$ and $f_T$ of the flexural resonator and the torsional resonator excited in the resonator gyro element 80 can approach each other. The frequency-temperature characteristics of the flexural resonator of the principal resonator are improved by combining two resonator modes, and the driving vibrating arms and the detecting vibrating arms are shortened by arranging the spindle portions 26, whereby the small-size resonator gyro sensor 4 can be configured.

As shown in FIG. 12A, the resonator gyro element 80 is configured in which the spindle portions 26 are formed in the tip end portions of the driving vibrating arms 83a to 84b, the first groove portions 27 extending in a linear shape along the longitudinal direction of the vibrating arms on the front and rear faces of the spindle portions 26, and the second groove portions 28 are formed on the front and rear faces of the driving vibrating arms along the resonator center line. By configuring such a resonator gyro element 80, the frequency-temperature characteristics of the flexural resonator that is the principal resonator of the flexure-torsional combined resonator excited in each driving vibrating arm represent third-order characteristics with respect to the temperature, and accordingly, there is an advantage of acquiring the resonator gyro element that has superior temperature characteristics and a small size.

In addition, as shown in FIG. 12A, by configuring a resonator gyro sensor by housing the resonator gyro element in a package, the frequency-temperature characteristics of the principal resonator of the flexure-torsional combined resonator excited in each driving vibrating arm is improved, and there is an advantage of acquiring a small-size resonator gyro sensor by arranging the spindle portions.

Figure 13:
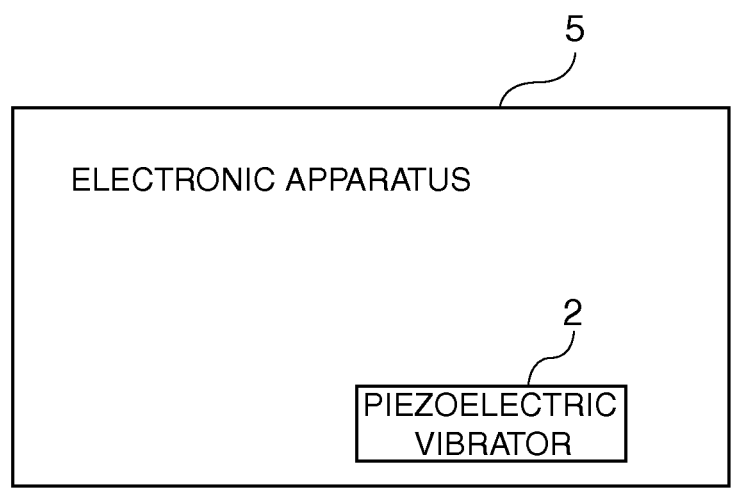
FIG. 13 is a schematic diagram of an electronic apparatus.

FIG. 13 is a schematic configuration diagram showing the configuration of an electronic apparatus according to the embodiment of the invention. In the electronic apparatus 5, the piezoelectric resonator 2 described in the above-described second embodiment is included. As examples of the electronic apparatus 5 using the piezoelectric resonator 2, there are mobile electronic apparatuses such as a cellular phone, a digital camera, and a video camera. In such electronic apparatuses 5, the piezoelectric resonator 5 is used as a reference signal source, and, by including the small-size piezoelectric resonator 2 having high precision, an electronic apparatus that has superior mobility due to its small size and has superior characteristics can be provided.

As shown in FIG. 13, by configuring the electronic apparatus that includes the piezoelectric resonator 2 shown in FIG. 10, there is an advantage of improving the stability of the frequency source of the electronic apparatus. In addition, by configuring the electronic apparatus including the resonator gyro sensor shown in FIG. 12A, there is an advantage of reducing the change in the sensitivity of the angular velocity according to the temperature.

In addition, regarding the groove portion, the first groove portions 22a and 22b and the first groove portions 24a an 24b shown in FIGS. 1A and 1B may be connected so as to form a so-called slit shape (through shape). Such a configuration may be applied to the embodiments shown in FIGS. 10 to 13.

Figure 14A:
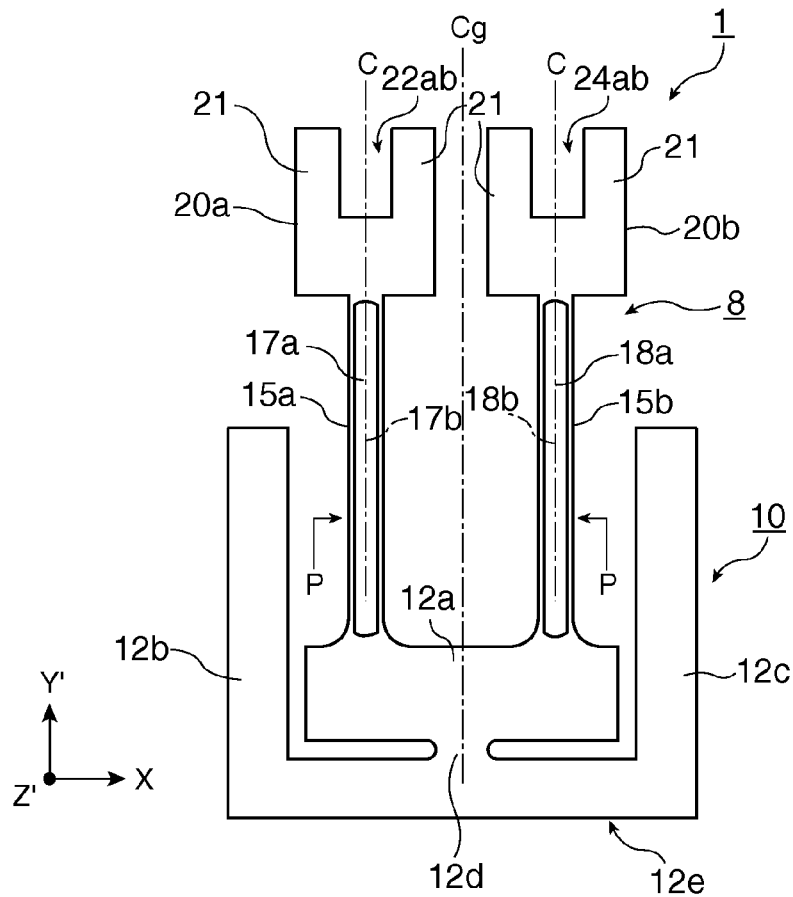
FIG. 14A is a schematic plan view showing the structure of a piezoelectric resonator element according to another embodiment of the invention.
Figure 14B:
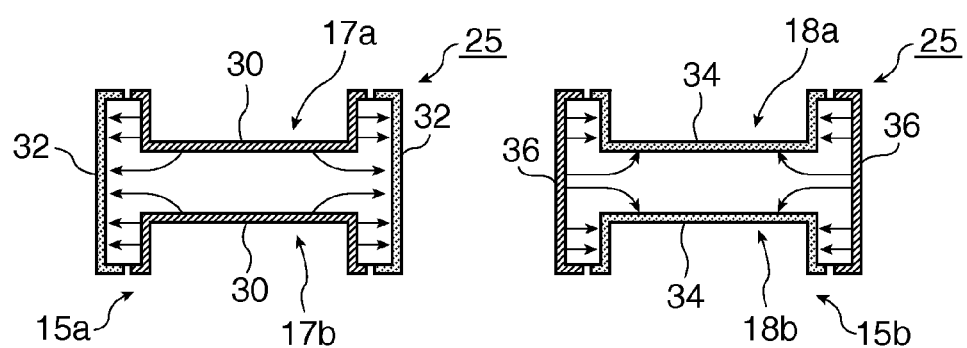
FIG. 14B is a cross-sectional view of a vibrating arm.

FIGS. 14A and 14B show another embodiment of the invention.

In the exemplary embodiment shown in FIG. 14A, the spindle portions 20a and 20b form a concave shape in the center portions of the tip end edges by forming notch portions (through portions) 22ab and 24ab as groove portions that are symmetrical with respect to the resonator center C in which the first groove portions 22a located on the front and rear sides are connected, and mass portions 21 are formed on both sides of each notch portion. In other words, in this embodiment, the mass portions 21 are arranged on both sides along the resonator center C with being separated from the resonator center C.

In the example in which the notch portions symmetrical with respect to the resonator center C are formed in the center portions of the tip end edges, since a shape is formed for which it is difficult for the effect of a difference in the etching speed according to the direction of the crystal axis, which is caused by the anisotropy unique to the piezoelectric substrate, to appear more than in the case of a bottomed groove portion, the mass portions 21 are arranged on both sides along the resonator center C with being separated from the resonator center C.

The cross-sectional view shown in FIG. 14B is a diagram showing the arrangement of excitation electrodes 30, 32, 34, and 36 formed in the vibrating arms 15a and 15b. The excitation electrodes 30 and 34 are formed on the front faces and the side faces of the groove portions 17a (17b) and 18a (18b), and the excitation electrodes 32 and 36 are formed on both side faces of the vibrating arms 15a and 15b.

The excitation electrodes 30 and 36 and the excitation electrodes 32 and 34 are applied with voltages having opposite signs through the above-described electrode pads. In other words, when positive voltages are applied to the excitation electrodes 30 and 36, negative voltages are applied to the excitation electrodes 32 and 34, and electric fields as denoted by arrows shown in FIG. 14B are generated, whereby tuning fork type resonator (flexural resonator) that is symmetrical to the center line Cg (hereinafter, referred to as a center line of center of gravity) passing through the center of gravity of the piezoelectric resonator element 1 is excited.

In addition, by forming the groove portions 17a (17b) and 18a (18b), the intensities of the electric fields are strong, whereby the tuning fork type resonator can be excited more efficiently. In other words, the CI (crystal impedance) of the piezoelectric resonator element can be configured to be low.

Figure 15:
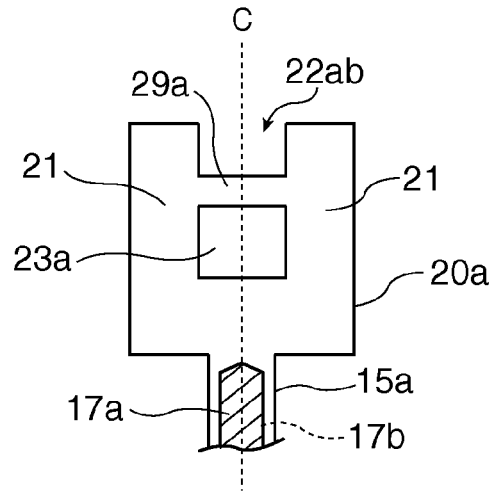
FIG. 15 is a plan view showing a modified example of a spindle portion that is connected to the tip end portion of the vibrating arm.

FIG. 15 is a plan view showing another exemplary embodiment (only one spindle portion 20a is shown) of the spindle portion 20a (20b). Through holes 23a (23b) that are symmetrical with respect to the resonator center C are formed within the plane of the spindle portion 20a (20b) closer to the vibrating arm 15a (15b) than a notch portion 22ab (24ab) shown in FIG. 15A. The mass portions 21 are arranged along the resonator center C on both sides with being separated from the resonator center C. By separating the notch portion 22ab (24ab) and a through hole 23a (23b) from each other, abridging portion 29a (29b) that connect the mass portions 21 having the resonator center C interposed therebetween is formed.

In addition, the width of the through hole 23a (23b) may be equal to or different from the width of the notch portion 22ab (24ab).

In the spindle portion 20a (20b) shown in FIG. 14A, there is a concern that the mass portions 21 located on the left and right sides of the resonator center C may unnecessarily vibrate when the piezoelectric resonator element 1 is excited, and the vibrating arms 15a and 15b vibrate in the flexure mode. In contrast to this, by arranging the bridging portion 29a (29b) as in the embodiment shown in FIG. 15, the unnecessary resonator of the mass portion 21 is suppressed, and the piezoelectric resonator element 1 that is strong for an impact and the like is acquired.

Figure 16:
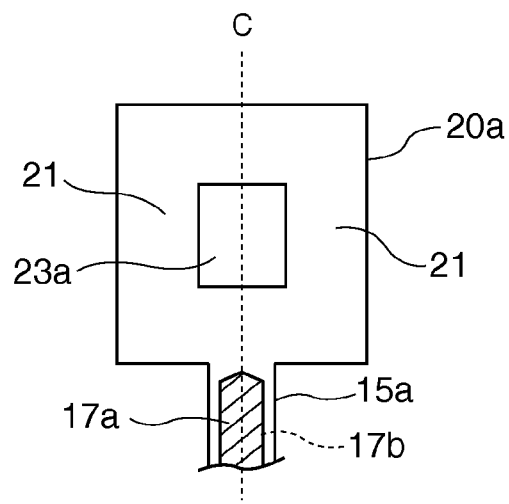
FIG. 16 is a plan view showing a modified example of the spindle portion.

FIG. 16 is a plan view showing yet another exemplary embodiment (only one spindle portion 20a is shown in the figure) of the spindle portion 20a (20b). As shown in the plan view of FIG. 16, a spindle portion 20a (20b) has a through hole 23a (23b) that is symmetrical with respect to the resonator center C in the center portion of the area of the spindle portion 20a (20b). As above, by arranging the through hole 23a (23b) in the center portion of the area of the spindle portion 20a (20b), the mass portions 21 are arranged along the resonator center C on both sides with being separated from the resonator center C.

Figure 17:
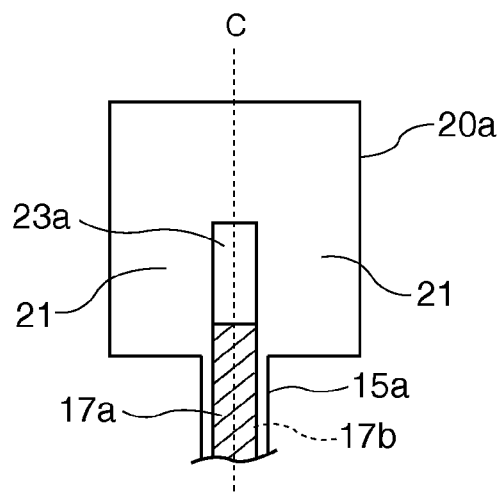
FIG. 17 is a plan view showing a modified example of the spindle portion.

FIG. 17 is a plan view showing still another exemplary embodiment (only one spindle portion 20a is shown in the figure) of the spindle portion 20a (20b). Each spindle portion 20a (20b) includes a through hole 23a (23b) that is symmetrical with respect to the resonator center C in the side end of the base portion, and the through hole 23a (23b) is connected (communicated with) to groove portions 17a and 17b(18a and 18b) of each vibrating arm 15a (15b). The mass portions 21 are arranged along the resonator center C on both sides with being separated from the resonator center C.

In the piezoelectric resonator element 1, flexural resonator that is symmetrical with respect to the center line Cg of the center of gravity in the direction of the vibrating arms 15a and 15b and torsional resonator that is symmetrical with respect to the center line Cg of the center of gravity, which pass the center of gravity, are excited. By appropriately forming the excitation electrode, the resonator mode to be principal resonator can be selected. The exemplary embodiment shown in FIGS. 14A and 14B is an example in which tuning fork resonator (flexural resonator) is configured as a principal resonator mode.

As an example of a piezoelectric resonator element according to the embodiment of the invention, a piezoelectric resonator element 1 is formed by using a substrate acquired by cutting out a quartz crystal Z substrate by rotating the electric axis (X axis) by θ (the range from 0 degree to −15 degrees). In the vibrating arms 15a and 15b, groove portions 17a (17b) and 18a (18b) are formed, and, in the spindle portions 20a and 20b, mass portions are formed along the resonator center C on both sides with being separated from the resonator center C.

In other words, by appropriately setting the cutting angle θ, the thickness of the piezoelectric substrate 8, the notch portions 22a and 22b of the spindle portions 20a and 20b or the through holes 23a and 23b and the groove portions 17a, 17b, 18a, and 18b, two resonator modes are combined by approaching the resonance frequencies $f_F$ and $f_T$ of the flexural resonator (tuning fork resonator) and the torsional resonator excited in the piezoelectric resonator element 1, whereby a tuning fork-type resonator element is configured of which the frequency-temperature characteristics of the flexural resonator as the principal resonator are improved and the size is decreased.

Here, units that allow the resonance frequencies $f_F$ and $f_T$ of the flexural resonator and the torsional resonator to approach each other are similar to those described with reference to FIGS. 4A to 4C.

FIGS. 4A to 4C can be used as diagrams qualitatively illustrating the changes in the resonance frequency $f_F$ of the flexural resonator and the resonance frequency $f_T$ of the torsional resonator, which are excited in the piezoelectric resonator element (tuning fork-type piezoelectric resonator element) 1 shown in FIG. 14A, according to the notch portions 22a and 22b of the spindle portions 20a and 20b, the groove portions 17a, 17b, 18a, and 18b of the vibrating arms 15a and 15b, and the thickness h of the vibrating arms 15a and 15b.

In addition, A and B denoted in the horizontal axis in FIGS. 4A and 4B represent the shapes of the beam (vibrating arm) 15, A represents a case before a notch portion is formed in the beam 15, and B represents a case where a notch portion is formed. In FIG. 4C, a case where the plate thickness h of the beam 15 is formed to be thicker than A is represented as B.

In this embodiment, by combining the flexural resonator and torsional resonator excited in the piezoelectric resonator element 1, the appearance of improving the frequency-temperature characteristics of flexural resonator of principal resonator is similar to that described with reference to FIGS. 7A to 7C.

FIG. 7A shows a quadratic curve with respect to temperature T as the frequency-temperature characteristics of the flexural resonator that is the principal resonator. FIG. 7B shows the frequency-temperature characteristics of the torsional resonator, and a frequency $\Delta f/f$ is approximated to a first-order equation with respect to temperature T. FIG. 7C is a diagram showing the frequency-temperature characteristics of the flexural resonator as the principal resonator in a case where the flexure resonator and the torsional resonator are combined. By combining the torsional resonator with the flexural resonator as the principal resonator, the first-order coefficient $\alpha$ and the second-order coefficient $\beta$ of the polynomial $\Delta f/f$ representing the frequency-temperature characteristics of the flexural resonator can be configured to be almost zero, and the frequency-temperature characteristics of the flexural resonator of the principal resonator can be approximated by a third-order coefficient $\gamma$ so as to represent a cubic curve as shown in FIG. 7C.

In addition, in a case where the plate thickness h of the vibrating arms 15a and 15b of the piezoelectric resonator element 1 is changed, the degree of combination between the flexural resonator and the torsional resonator acquired as a simulation result is the same as that shown in FIG. 8. In other words, the resonance frequency $f_F$ of the flexural resonator is approximately flat with respect to the thickness h and slightly decreases in accordance with an increase in the thickness h.

On the other hand, the resonance frequency $f_T$ of the torsional resonator increases in approximately proportional to an increase in the thickness h. In the example shown in FIG. 8, it can be understood that the combination increases at a plate thickness h slightly smaller than 86 µm.

Also in this embodiment, a simulation result of the first-order coefficient $\alpha$ and the second-order coefficient $\beta$ of the flexural resonator and the first-order coefficient $\alpha'$ and the second-order coefficient $\beta'$ of the torsional resonator excited in the piezoelectric resonator element 1 in which the groove portion (through portion) is formed along the resonator center C of the spindle portion 20a (20b) is the same as the trend of that shown in FIG. 9B. In the figure, the first-order coefficient $\alpha$ and the second-order coefficient $\beta$ are denoted by a diamond ◆ and a square ■ respectively, and the second-order coefficient $\beta'$ of the torsional resonator is denoted by a white square □. Since the first-order coefficient $\alpha'$ of the torsional resonator has a very large value so as to be out of the range of the graph, it is not shown in the figure. In other words, in the torsional resonator, the first-order coefficient $\alpha'$ is dominant.

FIG. 9B is a diagram, as described above, illustrating the first-order coefficients and the second-order coefficients $\alpha$, $\beta$, $\alpha'$ and, $\beta'$ of the flexural resonator and the torsional resonator with respect to the plate thickness h in a case where the plate thickness h of the vibrating arms 15a and 15b is changed in the range of 82 µm to 86 µm. In the example of FIG. 9B, it is determined that both the first-order coefficient $\alpha$ and the second-order coefficient $\beta$ of the flexural resonator are approximately zero near the plate thickness h=84.5 µm. In addition, it can be understood that the second-order coefficient $\beta'$ of the torsional resonator is approximately zero near the plate thickness h=84.5 µm.

In other words, in the example of the piezoelectric resonator element 1 shown in FIG. 9B, by setting the plate thickness h to 84.5 µm, both the first-order coefficient $\alpha$ and the second-order coefficient $\beta$ of the frequency-temperature characteristics of the flexural resonator as the principal resonator can be zero. Accordingly, the frequency-temperature characteristics of the flexural resonator represent a cubic curve, and the frequency-temperature characteristics are markedly improved. In addition, by arranging the spindle portions 20a and 20b, the vibrating arms are shortened, whereby a small-size piezoelectric resonator element 1 can be acquired.

In addition, by emitting laser beams to the electrodes formed on the front and rear faces of the spindle portions 20a and 20b, the electrodes of the groove portions 17a, 17b, 18a, and 18b, the electrodes formed in the vibrating arms 15a and 15b, and the like, the degree of combination of the flexural resonator and the torsional resonator excited in the tuning fork type piezoelectric resonator can be delicately adjusted.

Figure 18A:
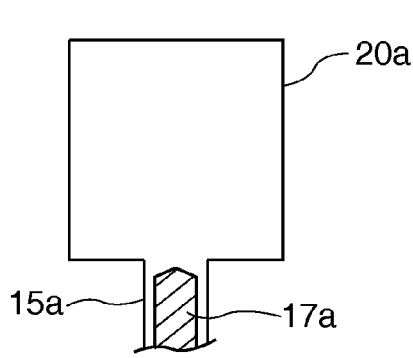
FIGS. 18A to 18E are plan views of a notch portion and a through hole formed in the spindle portion.
Figure 18B:
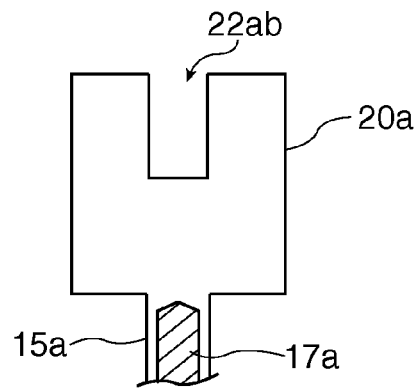
Figure 18C:
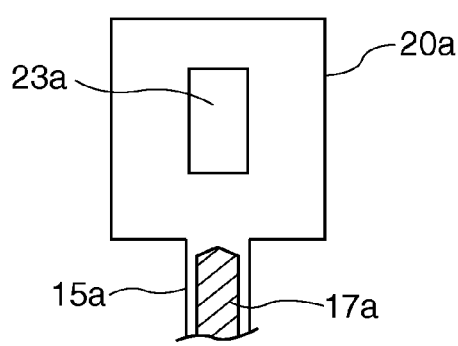
Figure 18D:
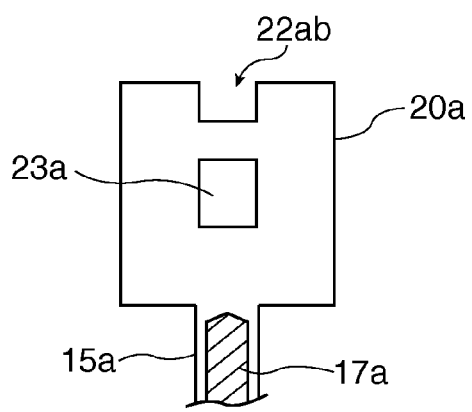
Figure 18E:
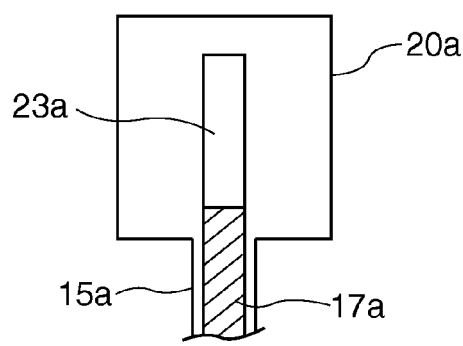
Figure 18F:
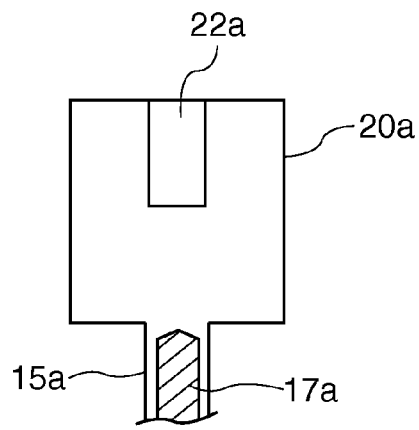
FIG. 18F is a plan view of a groove portion having the same area as that of the notch portion.

FIGS. 18A to 18F are diagrams showing the shapes in which a through portion-type groove portion is formed in the spindle portion 20a of the piezoelectric resonator element 1. FIG. 18A is a plan view of a rectangle-shaped spindle portion 20a that has not been processed at all, FIG. 18B is a plan view of a spindle portion 20a in which a notch portion 22ab is formed in the tip end edge, FIG. 18C is a plan view of a spindle portion 20a in which a through hole 23a is formed in the spindle portion shown in FIG. 18A, FIG. 18D is a plan view of a spindle portion 20a in which a notch portion 22ab of the tip end edge and a through hole 23a are formed, and FIG. 18E is a plan view of a spindle portion 20a in which a fine through hole 23a and a groove portion 17a connected thereto are formed. In FIGS. 18B to 18E, the area of the notch portion 22ab shown in FIG. 18B and the area of the through hole 23a or the area acquired by adding the areas of the notch portion 22ab and the through hole 23a shown in FIG. 18C and after that are the same. In addition, FIG. 18F is a plan view of a spindle portion 20a in which a (bottomed) groove portion 22a is formed along the resonator center C, and the area of the groove portion 22a is the same as the area of the notch portion 22ab shown in FIG. 18B. Drawings of spindle portions 20a that have groove portions 22a having the same area formed in correspondence with the through hole 23a shown in FIGS. 18C to 18E or the notch portion 22ab and the through hole 23a will not be presented.

The spindle portion 20a including the groove portion 22a is shown in FIG. 18F and is a diagram used for comparing with the spindle portion 20a including the notch portion 22ab when the degree of the approach between the frequencies of the flexural resonator and the torsional resonator excited in the piezoelectric resonator element 1 is acquired through a simulation.

The frequencies of the flexural resonator and the torsional resonator excited in the piezoelectric resonator element 1 including the spindle portion 20a shown in FIG. 18A are used as references, and the frequencies $f_F$ and $f_T$ of the flexural resonator and the torsional resonator and a frequency difference $\Delta f$ ($=f_T-f_F$) of each one of the piezoelectric resonator elements 1 including the spindle portions 20a shown in FIG. 18B to 18E and the piezoelectric resonator elements 1 including the groove portions 22a corresponding to FIG. 18F are simulated.

In the piezoelectric resonator elements 1 that include the notch portion 22ab or the notch portion 22ab and the through hole 23a shown in FIGS. 18B to 18E and the piezoelectric resonator elements 1 that include the groove portions 22a having the same area corresponding to FIGS. 18B to 18E, the changes in the frequencies $f_F$ and $f_T$ of the flexural resonator and the torsional resonator and a frequency difference $\Delta f$ are acquired through simulations.

Figure 19:
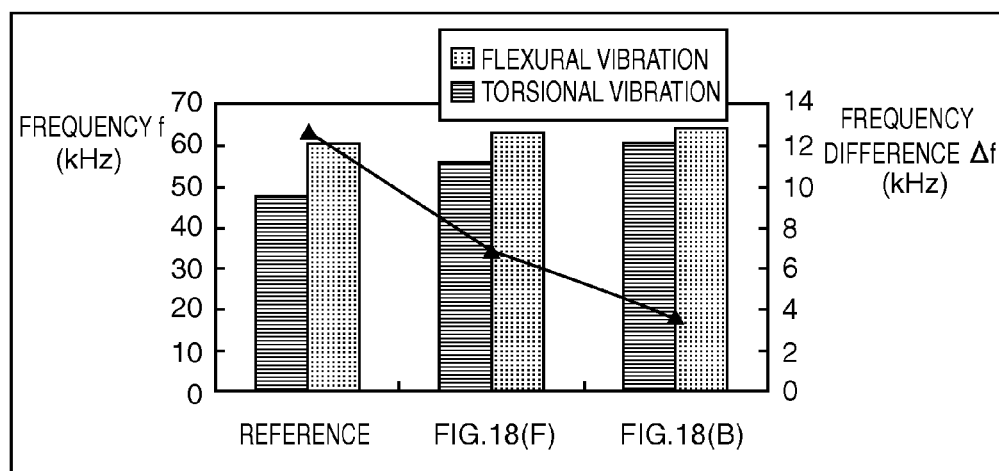
FIG. 19 is a diagram showing the frequencies of the flexural resonator and the torsional resonator excited in a tuning fork type piezoelectric resonator element having a notch portion in the shape shown in FIG. 18B and a tuning fork type piezoelectric resonator element having a groove portion that has the same area as that of the notch portion and a frequency difference thereof.

FIG. 19 is a diagram showing the frequencies $f_F$ and $f_T$ of the flexural resonator and the torsional resonator excited in each one of a piezoelectric resonator element 1, shown in FIG. 18B, including a notch portion 22ab having the shape shown in FIG. 18B and a piezoelectric resonator element 1, shown in FIG. 18F, including a groove portion 22a that has the same area as that of the notch portion 22ab shown in FIG. 18B and each frequency difference Δf thereof. It is represented that a frequency difference Δf between the frequencies of the flexural resonator and the torsional resonator of the piezoelectric resonator element 1 in which the notch portion 22ab is formed is smaller, and the flexural resonator and the torsional resonator approach each other.

Figure 20:
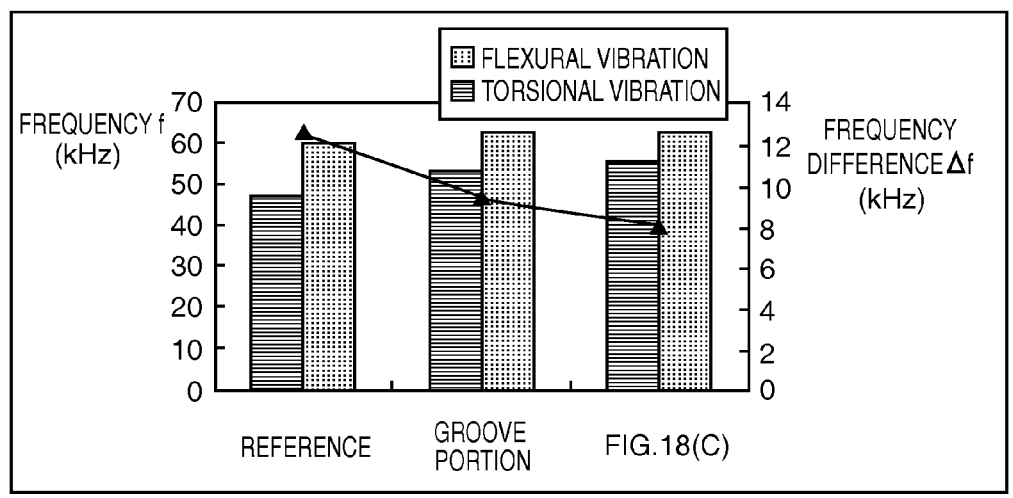
FIG. 20 is a diagram showing the frequencies of the flexural resonator and the torsional resonator excited to a tuning fork type piezoelectric resonator element having a through hole in the shape shown in FIG. 18C and a tuning fork type piezoelectric resonator element having a groove portion that has the same area as that of the through hole and a frequency difference thereof.

FIG. 20 is a diagram showing the frequencies $f_F$ and $f_T$ of the flexural resonator and the torsional resonator excited in each one of a piezoelectric resonator element 1 including a through hole 23a having the shape shown in FIG. 18C and a piezoelectric resonator element 1 including a groove portion 22a that has the same area as that of the through hole 23a and each frequency difference Δf thereof.

It is represented that a frequency difference Δf between the frequencies of the flexural resonator and the torsional resonator of the piezoelectric resonator element 1 in which the through hole 23a is formed is smaller, and the flexural resonator and the torsional resonator approach each other.

Figure 21:
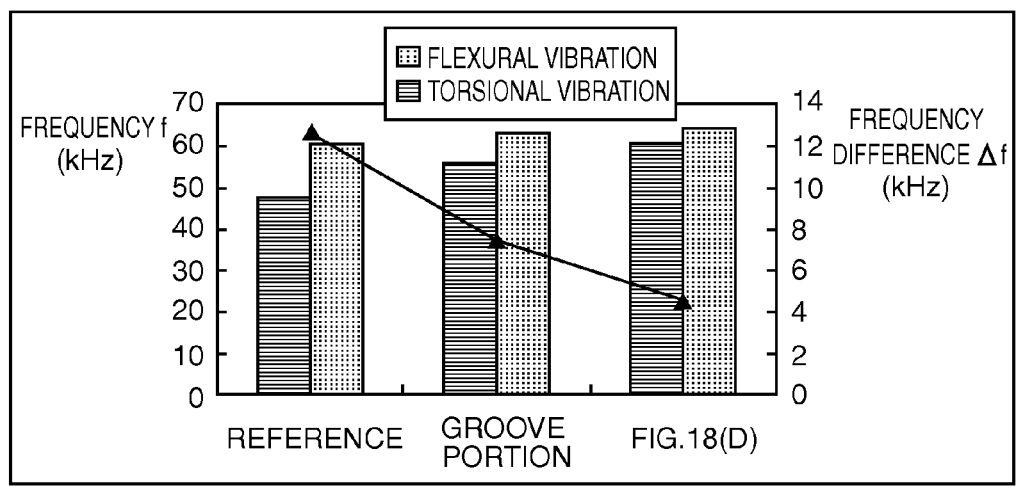
FIG. 21 is a diagram showing the frequencies of the flexural resonator and the torsional resonator excited to a tuning fork type piezoelectric resonator element having a notch portion and a through hole in the shape shown in FIG. 18D and a tuning fork type piezoelectric resonator element having a groove portion that has the same area as that of the notch portion and the through hole and a frequency difference thereof.

FIG. 21 is a diagram showing the frequencies $f_F$ and $f_T$ of the flexural resonator and the torsional resonator excited in each one of a piezoelectric resonator element 1 including a notch portion 22ab having the shape shown in FIG. 18D and a through hole 23a and a piezoelectric resonator element 1 including a groove portion 22a that has the same area as that of the notch portion 22ab and the through hole 23a and each frequency difference Δf thereof. It is represented that a frequency difference Δf between the frequencies of the flexural resonator and the torsional resonator of the piezoelectric resonator element 1 in which the notch portion 22ab and the through hole 23a are formed is smaller, and the flexural resonator and the torsional resonator approach each other.

Figure 22:
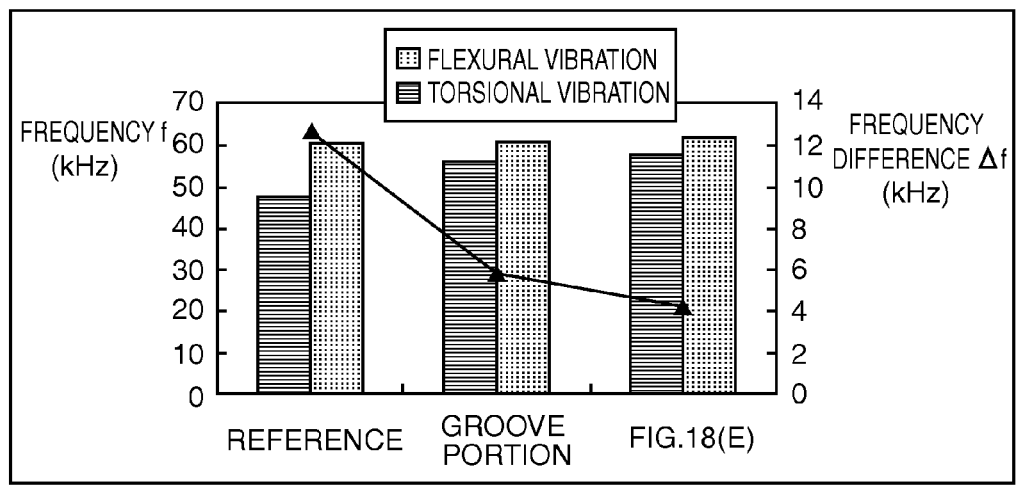
FIG. 22 is a diagram showing the frequencies of the flexural resonator and the torsional resonator excited to a tuning fork type piezoelectric resonator element having a fine through hole and a groove portion connected thereto in the shape shown in FIG. 18E and a tuning fork type piezoelectric resonator element having a groove portion that has the same area as that of the fine through hole and the groove portion connected thereto and a frequency difference thereof.

FIG. 22 is a diagram showing the frequencies $f_F$ and $f_T$ of the flexural resonator and the torsional resonator excited in each one of a piezoelectric resonator element 1 including a fine through hole 23a having the shape shown in FIG. 18E and a groove portion 17a connected thereto and a piezoelectric resonator element 1 including a groove portion 22a that has the same area as the area acquired by adding the area of the fine through hole 23a and the area of the groove portion 17a and each frequency difference Δf thereof. It is represented that a frequency difference Δf between the frequencies of the flexural resonator and the torsional resonator of the piezoelectric resonator element 1 in which the a fine through hole 23a and a groove portion 17a connected are formed is smaller, and the flexural resonator and the torsional resonator approach each other.

Figure 23:
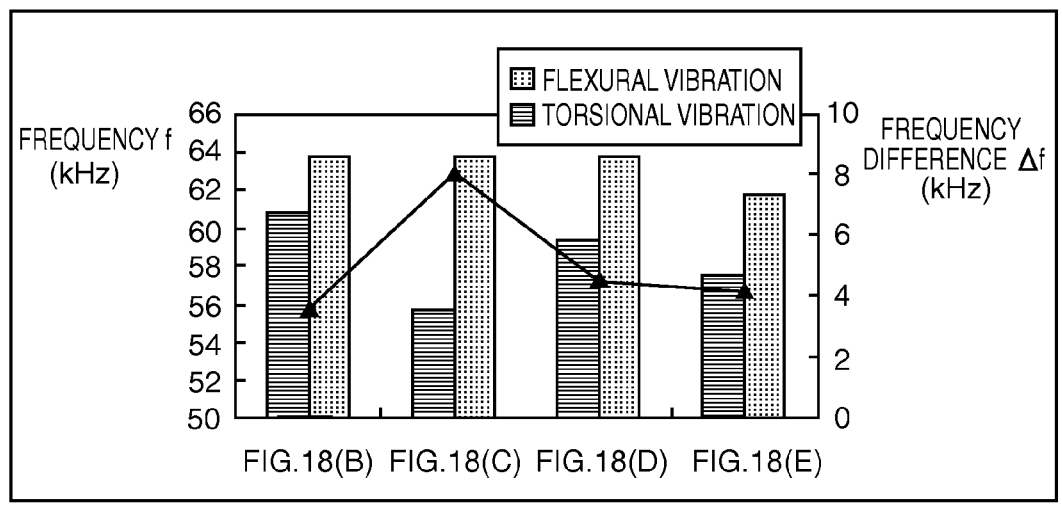
FIG. 23 is a diagram showing the frequencies of the flexural resonator and the torsional resonator excited to a tuning fork type piezoelectric resonator element having a spindle portion in the shapes shown in FIGS. 18B to 18E and a frequency difference thereof.

FIG. 23 is acquired by collecting the above-described results, and is a diagram in which the frequencies $f_F$ and $f_T$ of the flexural resonator and the torsional resonator excited in each one of the piezoelectric resonator elements 1 having the shapes shown in FIGS. 18B to 18E and each frequency difference Δf thereof are represented in correspondence with signs (b) to (e) in the horizontal axis in the vertical axes located on the left and right sides. In the case of the shape shown in FIG. 18B, in other words, in a case where a notch portion 22ab symmetrical with respect to the resonator center C is formed in the spindle portion 20a, the frequency difference Δf is the smallest.

Figure 24:
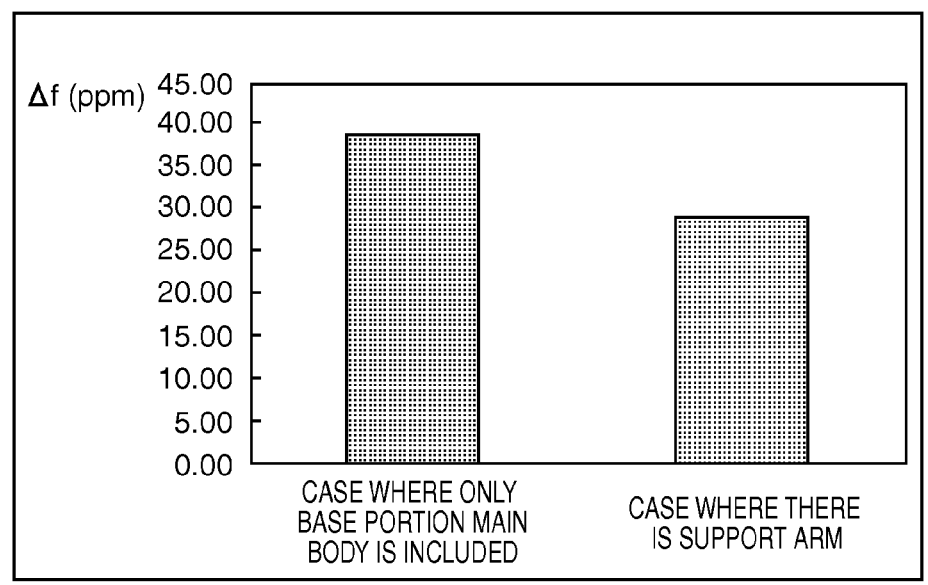
FIG. 24 is a diagram showing resonator leakages in a tuning fork type piezoelectric resonator element having only a base portion main body and a tuning fork type resonator element having a base portion including a support arm, which are acquired through simulation.

FIG. 24 is a diagram for comparing resonator leakage of a tuning fork type piezoelectric resonator element 1 that includes only the base portion main body 12a and resonator leakage of a tuning fork type piezoelectric resonator element that includes a base portion 10 including the base portion main body 12a, the connection portion 12d, and the support arms 12b and 12c which are acquired through simulations. It is apparent that the tuning fork type piezoelectric resonator element 1 that includes the base portion 10 including the support arms 12b and 12c has less resonator leakage.

As shown in the embodiment shown in FIGS. 14A and 14B, according to the piezoelectric resonator element (tuning fork type piezoelectric resonator element) 1 according to the embodiment of the invention, the spindle portion is formed in the tip end portion of each vibrating arm, and the mass portions having a heavy mass are arranged on both sides of the resonator center in the spindle portion so as to be symmetrical. Moreover, in each vibrating arm, the groove portions are formed on the front and rear faces along the resonator center. By configuring as such, the flexural resonator and the torsional resonator excited in the piezoelectric resonator element 1 approach each other so as to be combined together. By appropriately setting the thickness of the piezoelectric substrate, the cutting angle, and the shapes of each mass portion and each groove portion, the frequency-temperature characteristics of the flexure resonator as the principal resonator of the flexure-torsional combined resonator represent third-order characteristics with respect to the temperature, and accordingly, there is an advantage of acquiring the piezoelectric resonator element that has superior temperature characteristics and has a small size.

In addition, the piezoelectric resonator element (tuning fork-type piezoelectric resonator element) 1 acquired by rotating the cutting angle of the piezoelectric substrate 8 around the electric axis (X axis) in the range of 0 degree to −15 degrees, which is represented in the embodiment shown in FIG. 14A, is configured. By setting the cutting angle as such and appropriately setting the thickness of the piezoelectric substrate and the like, the first-order coefficient and the second-order coefficient of a polynomial representing the frequency-temperature characteristics of the flexure-torsional combined resonator can be set to approximate zero, and accordingly, there is an advantage of acquiring the piezoelectric resonator element having superior temperature characteristics.

As shown in the embodiment shown in FIGS. 14A and 14B, by arranging the notch portions 22ab and 24ab that are symmetrical with respect to the resonator center C in the center portions of the tip end edges of the spindle portions 20a and 20b, the flexural resonator (tuning fork resonator) and the torsional resonator excited in the piezoelectric resonator element 1 can approach each other so as to be combined. In addition, by appropriately setting the parameters, there is an advantage of configuring the frequency-temperature characteristics of the flexural resonator of the flexure-torsional combined resonator to represent third-order characteristics.

In addition, as shown in the embodiment shown in FIG. 15, the spindle portions 20a and 20b are reinforced by decreasing the size of the notch portion 22ab so as to be combined with the through hole 23a, arranging the mass portions 21 to be symmetrical with respect to the resonator center C on both sides thereof, and arranging the bridging portion 29a between both the mass portions 21. At the same time, the flexural resonator (tuning fork resonator) and the torsional resonator can approach each other so as to be combined together. Furthermore, by appropriately setting the parameters, there is an advantage of configuring the frequency-temperature characteristics of the flexural resonator of the flexure-torsional combined resonator to represent third-order characteristics.

As shown in the embodiment shown in FIG. 16, by arranging the through hole 23a (23b) in the center portion, although the rigidity of the spindle portions 20a and 20b increases, the change in the frequency of the flexural resonator slightly decreases. However, by slightly increasing the area of the through hole 23a (23b), the decrease in the frequency can be supplemented. Also in such a case, the flexural resonator (tuning fork resonator) and the torsional resonator can approach each other so as to be combined together. In addition, by appropriately setting the parameters, there is an advantage of configuring the frequency-temperature characteristics of the flexural resonator of the flexure-torsional combined resonator to represent third-order characteristics.

In addition, as shown in the embodiment shown in FIG. 17, by arranging the through hole 23a (23b) at the base portion side end of the spindle portions 20a and 20b, although the change in the frequency of the flexural resonator slightly decreases, by extending the groove portions of the vibrating arms, the frequency of the torsional resonator decreases, whereby the frequencies of the flexural resonator and the torsional resonator approach each other so as to be combined together. In addition, by appropriately setting the parameters, there is an advantage of configuring the frequency-temperature characteristics of the flexural resonator of the flexure-torsional combined resonator to represent third-order characteristics.

Furthermore, as shown in FIG. 14A, the base portion 10 of the piezoelectric resonator element (tuning fork type piezoelectric resonator element) 1 includes the base portion main body 12a, the connection portion 12d, and the support arms 12b and 12c having the "L" shape and the reverse "L" shape, the end portions of the "L" shape and the reverse L shape are connected, and the connection portion is configured to be connected to the center portion of one end portion of the base portion main body 12a through the connection portion 12d. Accordingly, the resonator energy leaking to the support arms 12b and 12c from the vibrating arms 15a and 15b can be reduced, and the CI value is decreased. In addition, the impact is alleviated based on the structure of the base portion, whereby the shock resistance is improved. As a result, there is an advantage of acquiring the piezoelectric resonator element having no problem of frequency variations due to a damage, a destruction, or the like that is caused by an impact.

The entire disclosure of Japanese Patent Application Nos: 2011-039519, filed Feb. 25, 2011 and 2011-047268 filed Mar. 4, 2011 are expressly incorporated by reference herein.

What is claimed is:
1. A resonator element comprising:
a base; and
a pair of vibrating arms that extends from the base in a first direction in a plan view, the vibrating arms are located next to each other in a second direction perpendicular to the first direction, the vibrating arms performing flexure-torsional combined vibrations, each of the vibrating arms having a spindle portion and an arm portion, the arm portion being sandwiched by the base and the spindle portion, wherein
the spindle portion has a first surface and a second surface that is opposite to the first surface, and a first groove is provided in at least one of the first and second surfaces,
the arm portion has a third surface, which is continuous with the first surface, and a fourth surface, which is continuous with the second surface and opposite to the third surface, a second groove is provided in at least one of the third and fourth surfaces, and the second groove extends along the first direction,
each of the first and second grooves overlaps with an imaginary line passing through a center of gravity of each of the vibrating arms in a plan view,
the first and second grooves are separately provided, and
an electrode is provided on the first surface, the second surface, an inner surface of the first groove, a side surface that interconnects the third surface and the fourth surface, and an inner surface of the second groove.

2. The resonator element, according to claim 1, wherein a width of the spindle portion in the second direction is larger than a width of the arm portion in the second direction.

3. The resonator element, according to claim 1, wherein the resonator element is configured with a quartz crystal plate, and
a normal line of a principal surface of the quartz crystal plate is inclined by an angle within a range of 0 degree to −15 degrees with respect to an optical axis of a quartz crystal of the quartz crystal plate.

4. The resonator element, according to claim 1, wherein the first groove is configured with a plurality of grooves that are separately aligned to each other in the first direction.

5. The resonator element, according to claim 1, wherein the first groove extends from an outer edge, which is opposite to the arm portion, of the spindle portion toward a center of the spindle portion.

6. The resonator element, according to claim 1, wherein a width of at least a part of the first groove in the second direction is larger than a width of the second groove in the second direction.

7. The resonator element, according to claim 1, wherein the base includes:
a base main body from which the vibrating arms extend;
a connecter that is provided at an edge of the base main body located on an opposite side with respect to the vibrating arms in the plan view, a width of the connecter in the second direction is smaller than a width of the base main body in the second direction; and
a support arm that extends from the connecter and that is spaced apart from the base main body.

8. A resonator comprising:
the resonator element according to claim 1; and
a substrate on which the resonator element is mounted.

9. An oscillator comprising:
the resonator element according to claim 1;
an IC that drives resonator element.

10. A gyro sensor comprising:
the resonator element according to claim 1.

11. An electronic apparatus comprising:
the resonator element according to claim 1.

12. A resonator element comprising:
a base; and
a pair of vibrating arms that extends from the base in a first direction in a plan view, the vibrating arms are located next to each other in a second direction perpendicular to the first direction, the vibrating arms performing flexure-torsional combined vibrations, each of the vibrating arms having a spindle portion and an arm portion, the arm portion being sandwiched by the base and the spindle portion, wherein
the spindle portion has a first surface and a second surface that is opposite to the first surface, and a first groove is provided in at least one of the first and second surfaces,
the arm portion has a third surface, which is continuous with the first surface, and a fourth surface, which is continuous with the second surface and opposite to the third surface, a second groove is provided in at least one of the third and fourth surfaces, and the second groove extends along the first direction, each of the first and second grooves overlaps with an imaginary line passing through a center of gravity of each of the vibrating arms in a plan view, the first groove extends from an outer edge, which is opposite to the arm portion, of the spindle portion so as to integrate with the second groove, and an electrode is provided on the first surface, the second surface, an inner surface of the first groove, a side surface that interconnects the third surface and the fourth surface and an inner surface of the second groove.

* * * * *